United States Patent [19]
Anderson et al.

[11] Patent Number: 5,459,340
[45] Date of Patent: Oct. 17, 1995

[54] ADAPTIVE CONFIGURABLE GATE ARRAY

[75] Inventors: James M. Anderson, Huntington Beach; Andrew R. Coulson, Santa Monica; Vincent J. Demaioribus, Scott Valley; Henry T. Nicholas, Redondo Beach, all of Calif.

[73] Assignee: TRW Inc., Redondo Beach, Calif.

[21] Appl. No.: 275,921

[22] Filed: Jul. 14, 1994

Related U.S. Application Data

[63] Continuation of Ser. No. 933,442, Oct. 5, 1992, abandoned, which is a continuation-in-part of Ser. No. 803,944, Dec. 9, 1991, abandoned, which is a continuation of Ser. No. 416,635, Oct. 3, 1989, abandoned.

[51] Int. Cl.$^6$ .................... H01L 27/10; H01L 27/15
[52] U.S. Cl. .................... 257/203; 257/204; 257/205
[58] Field of Search ............................ 257/208, 210, 257/205, 203, 202, 204

[56] References Cited

U.S. PATENT DOCUMENTS

| | | | |
|---|---|---|---|
| 4,200,395 | 4/1980 | Smith | 356/356 |
| 4,603,473 | 8/1986 | Suemitsu et al. | 29/578 |
| 4,644,382 | 2/1987 | Charransol | 357/42 |
| 4,688,072 | 8/1987 | Heath | 357/45 |
| 4,691,434 | 9/1987 | Percival | 437/143 |
| 4,700,187 | 10/1987 | Furtek | 340/825.83 |
| 4,701,777 | 10/1987 | Takayama | 357/42 |
| 4,703,436 | 10/1987 | Varshney | 364/490 |
| 4,733,288 | 3/1988 | Sato | 357/40 |
| 4,742,383 | 5/1988 | Fitzgerald | 357/45 |
| 4,745,084 | 5/1988 | Lowson | 437/51 |
| 4,766,476 | 8/1988 | Schallenberger | 357/42 |
| 4,771,327 | 9/1988 | Usui | 357/45 |
| 4,783,692 | 11/1988 | Uratani | 357/45 |
| 4,864,381 | 9/1989 | Seefeldt et al. | 357/45 |
| 4,942,447 | 7/1990 | Park et al. | 357/42 |
| 4,960,724 | 10/1990 | Watanabe et al. | 437/51 |
| 4,967,259 | 10/1990 | Takagi . | |
| 4,978,633 | 12/1990 | Seefeldt et al. | 437/51 |
| 5,051,807 | 9/1991 | Morozumi . | |
| 5,217,916 | 6/1993 | Anderson et al. | 437/51 |
| 5,350,704 | 9/1994 | Anderson et al. | 437/51 |

FOREIGN PATENT DOCUMENTS

| | | | |
|---|---|---|---|
| 61-144843 | 7/1986 | Japan . | |
| 63-31131 | 2/1988 | Japan | 257/202 |

*Primary Examiner*—William L. Sikes
*Assistant Examiner*—Hung Xuan Dang

[57] ABSTRACT

A new configurable gate array is defined in a master slice wafer form without borders of the kind currently known between constituent transistor gates, effectively providing a sea of gates over the wafer, interrupted if at all by islands, containing markers or the like; and a resultant application specific integrated circuit formed of such master slice is defined. In the IC, transistor gate cells, which are the same type of cells used for other purposes in the IC, are configured to serve the input and output function. Accordingly, the input and output function may be placed on any location in the IC. As an incident to personalization of the wafer saw lanes are formed of channels that extend over transistor cells and the latter cells are consequently destroyed in slicing the wafer.

18 Claims, 9 Drawing Sheets

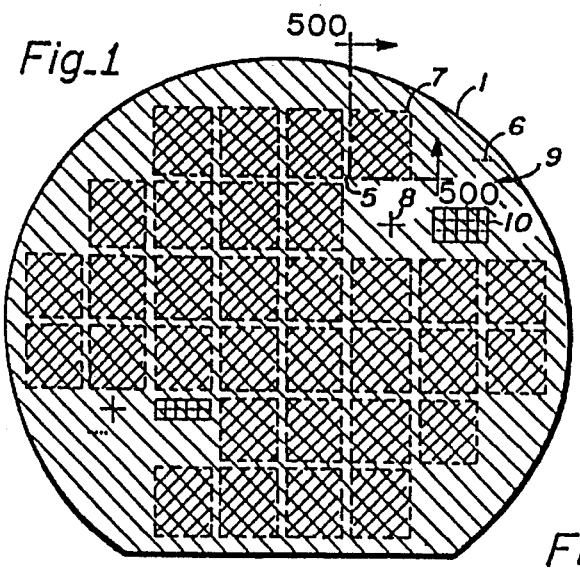
Fig_1
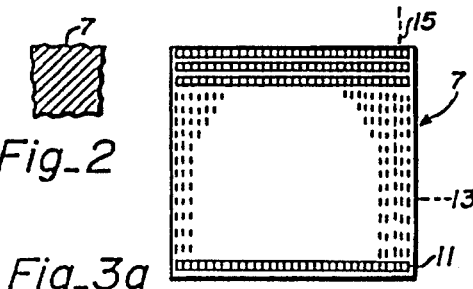
Fig_2   Fig_3a
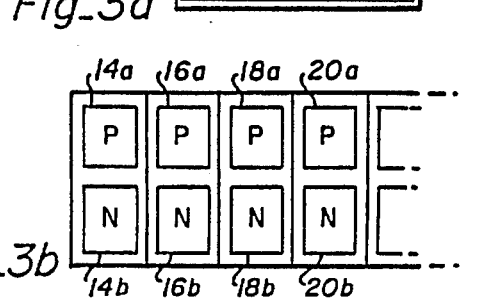
Fig_3b
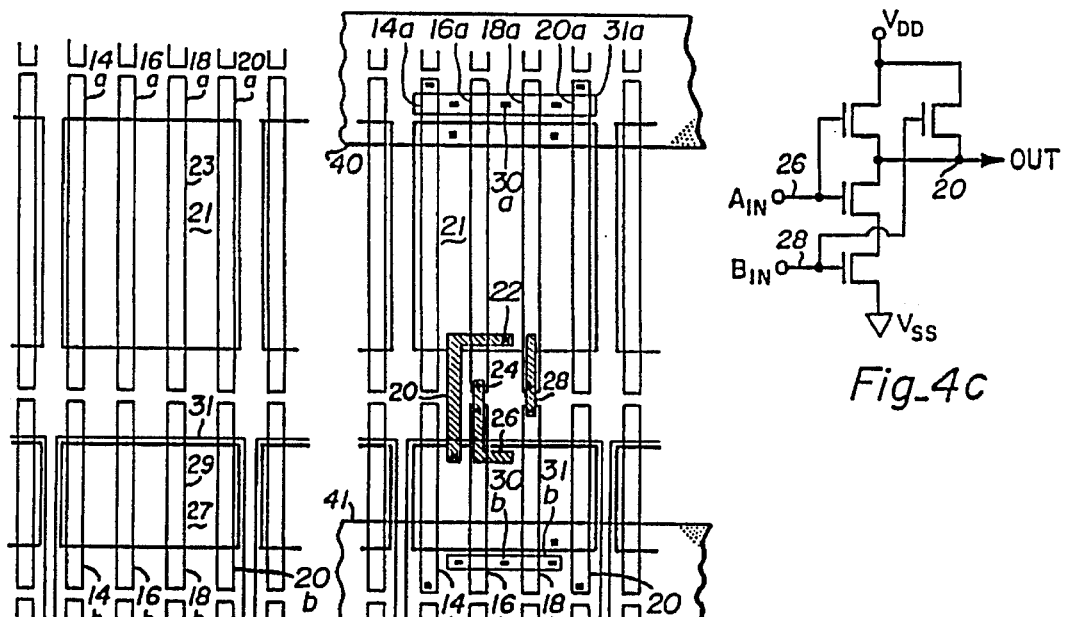
Fig_4a   Fig_4b   Fig_4c
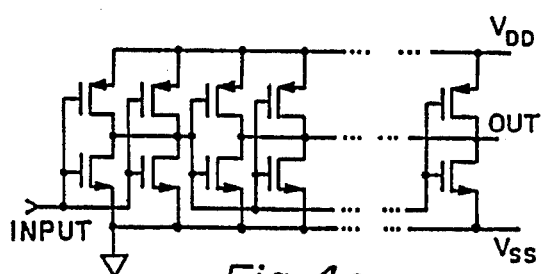
Fig_4e
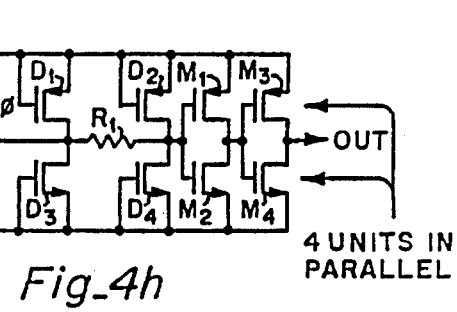
Fig_4h
4 UNITS IN PARALLEL

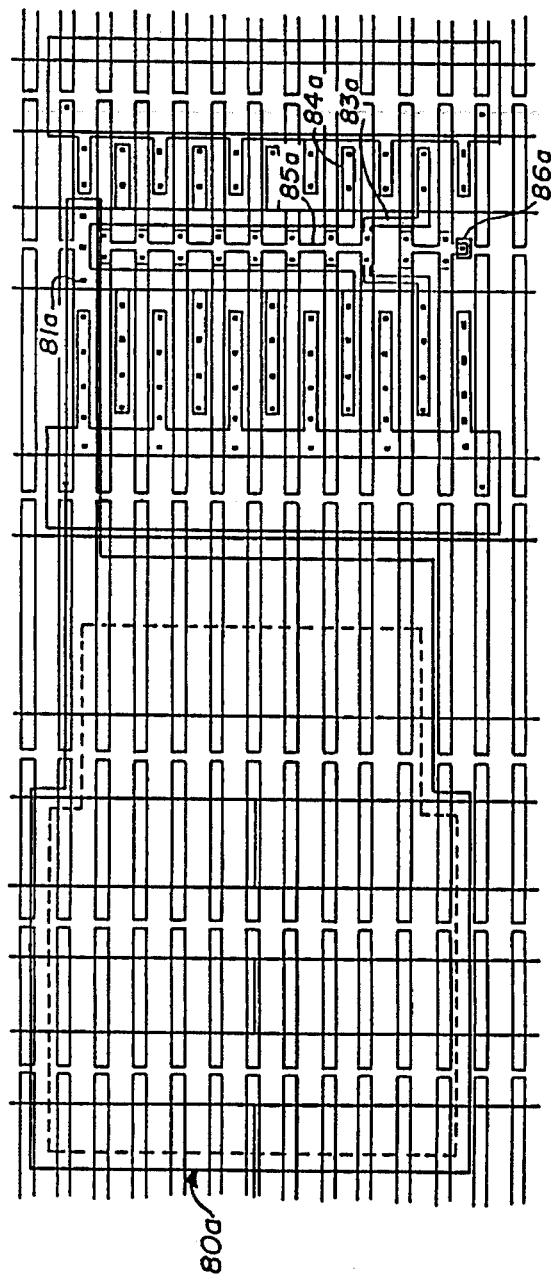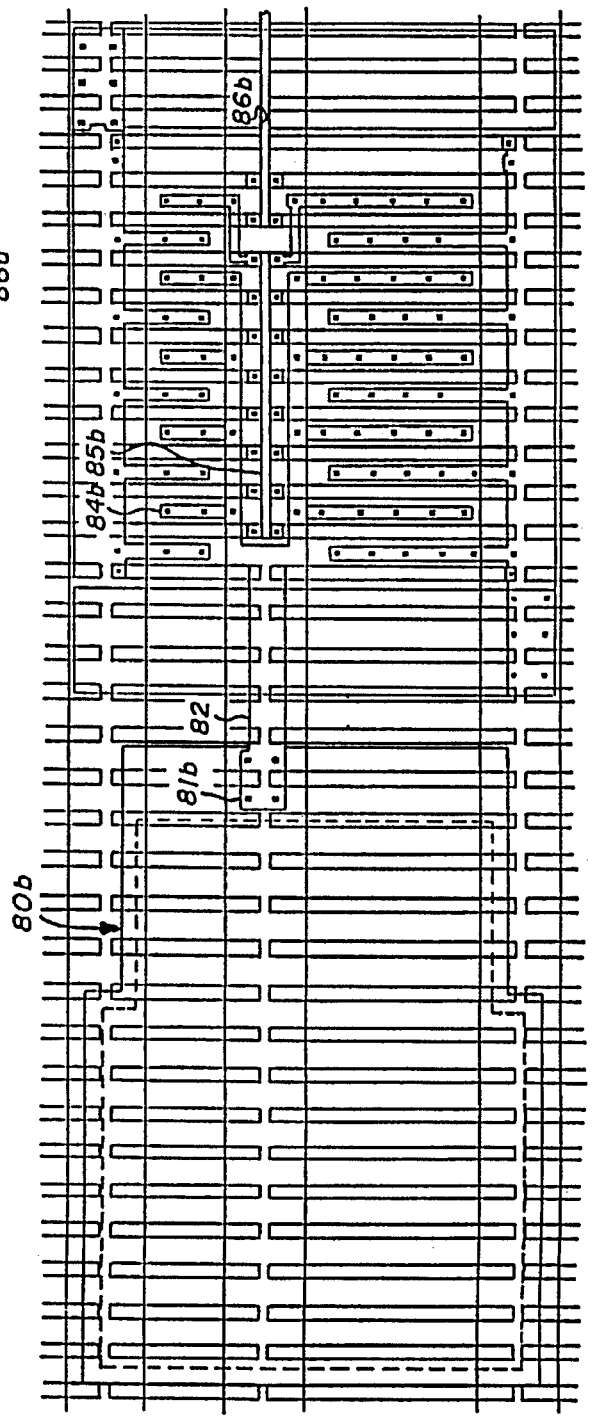

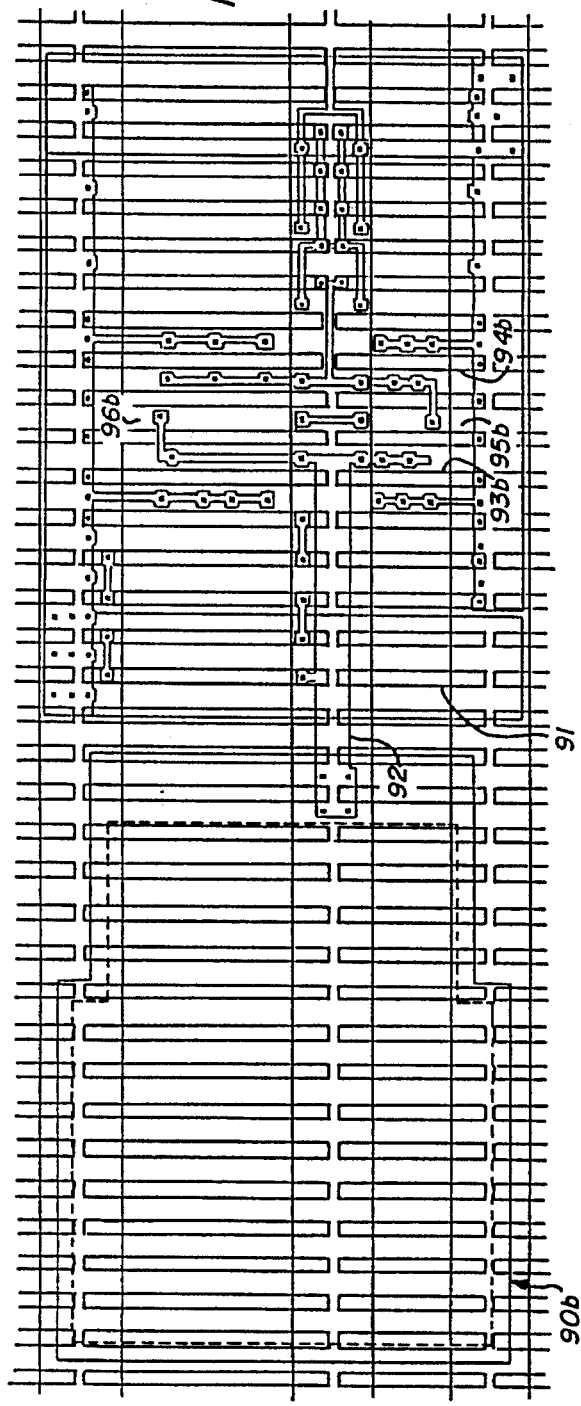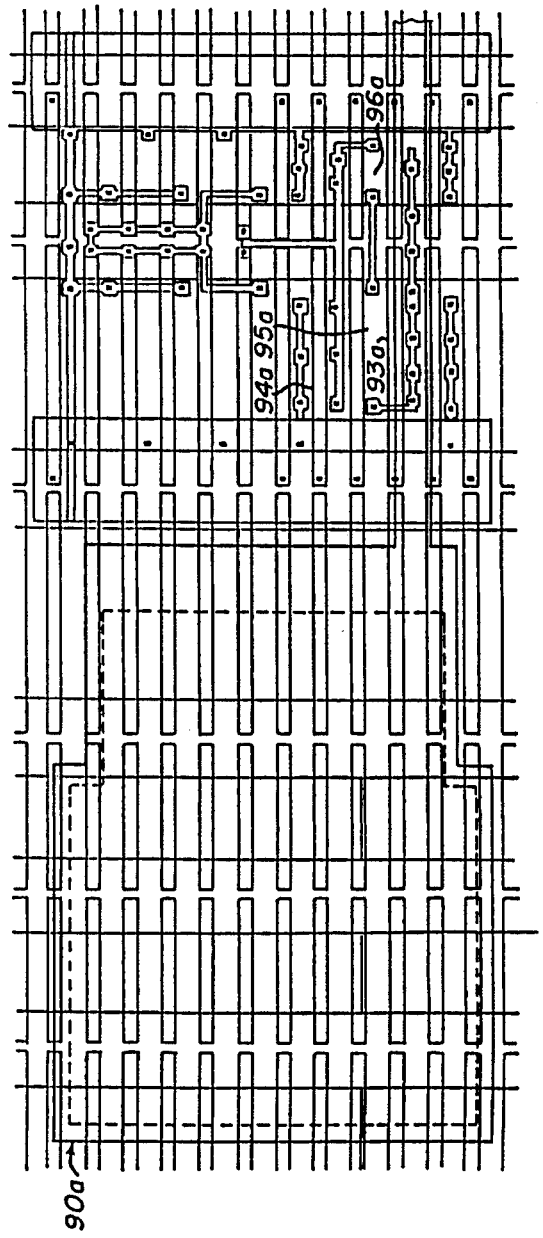

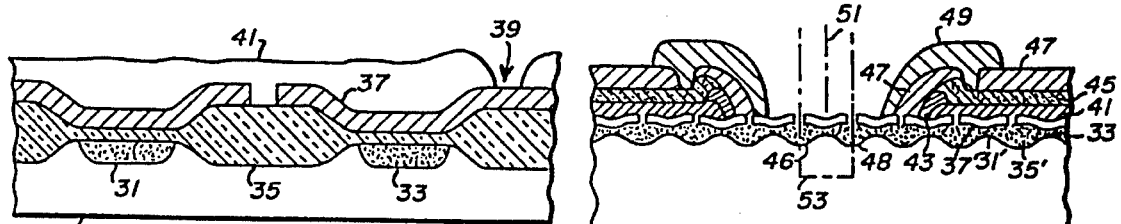
Fig_6a    Fig_6b
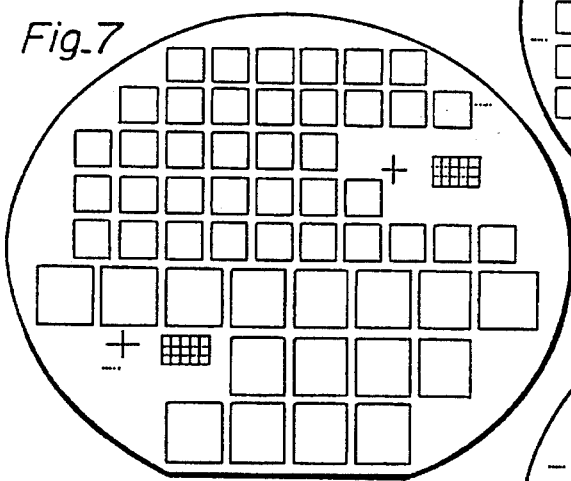
Fig_7
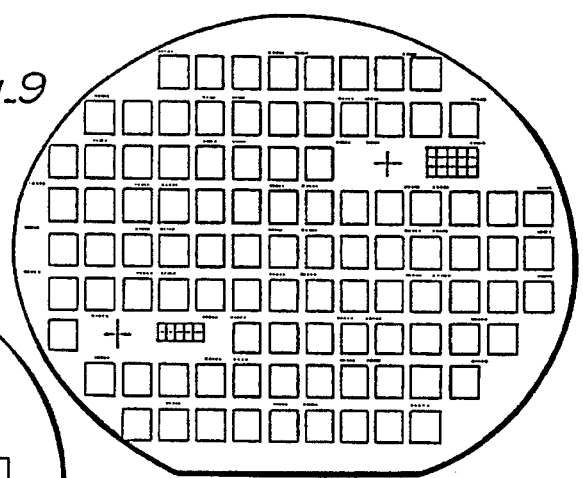
Fig_9
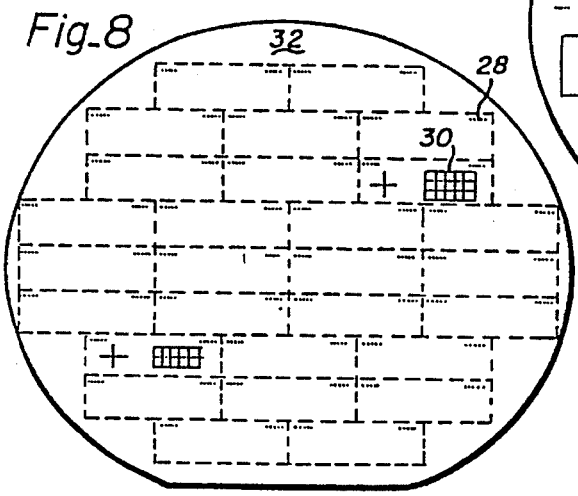
Fig_8
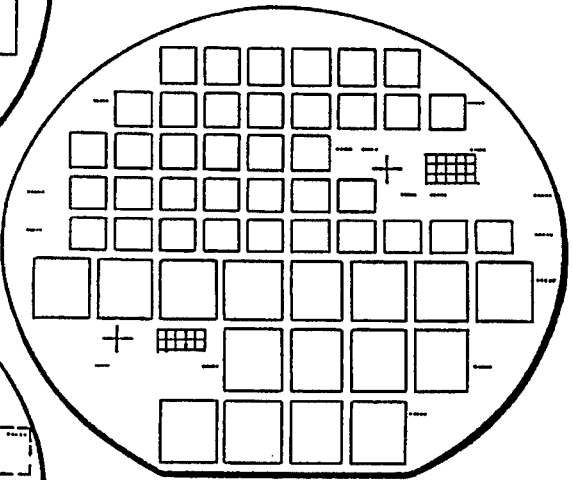
Fig_10

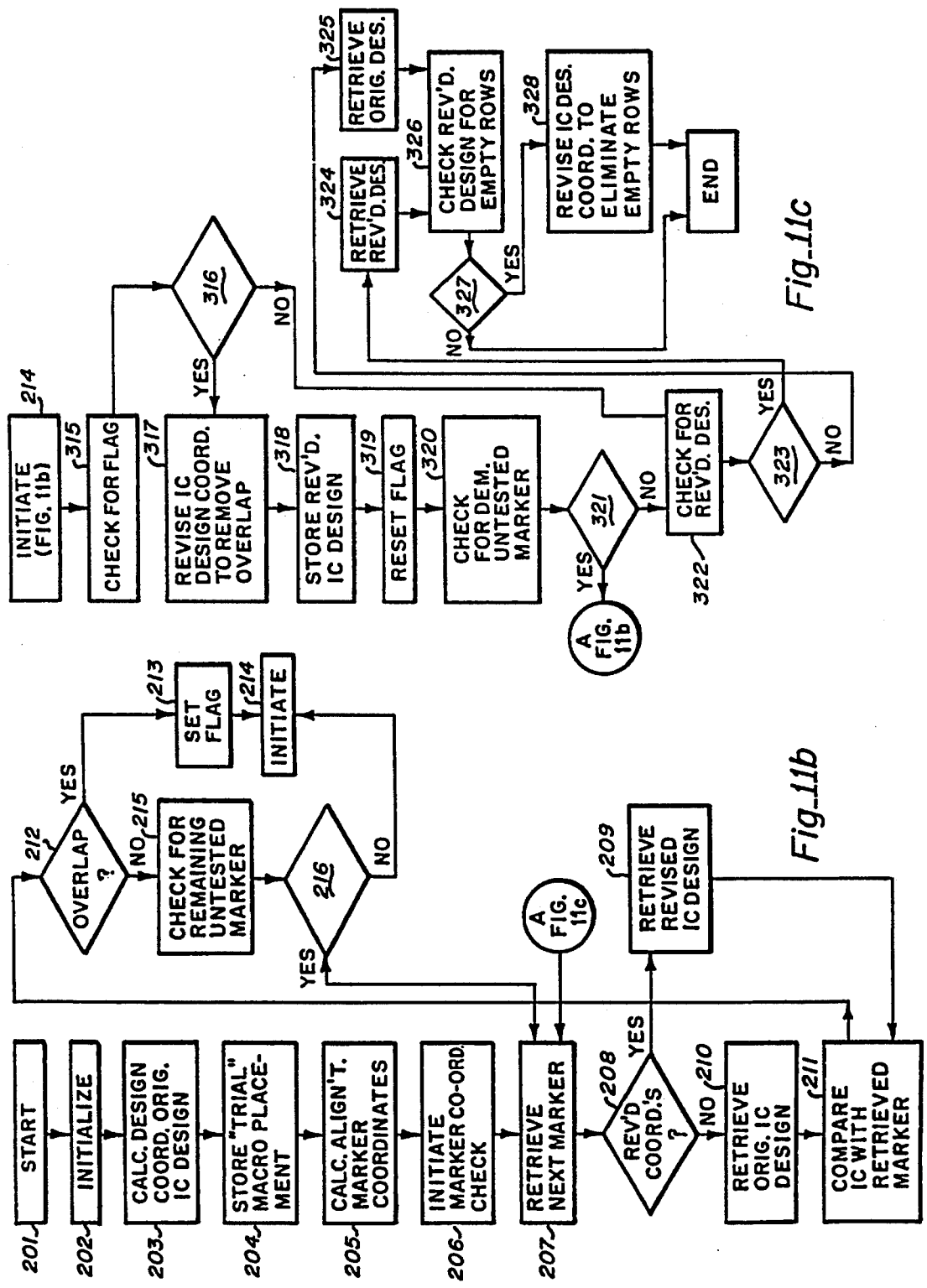

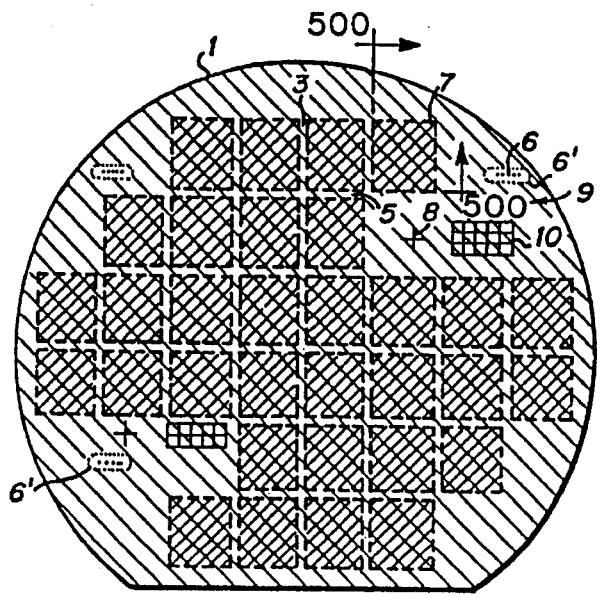
Fig_13
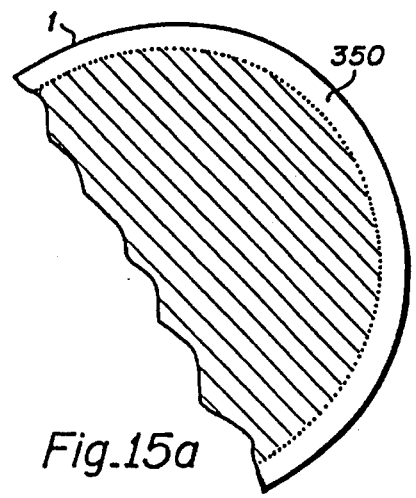
Fig_15a
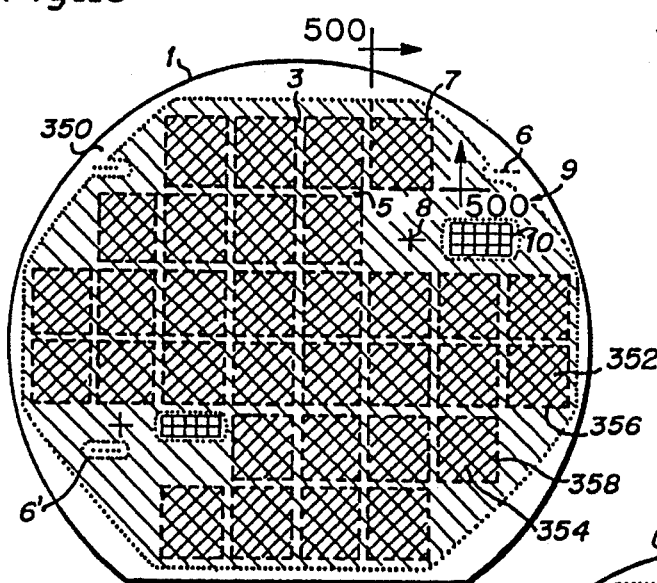
Fig_14
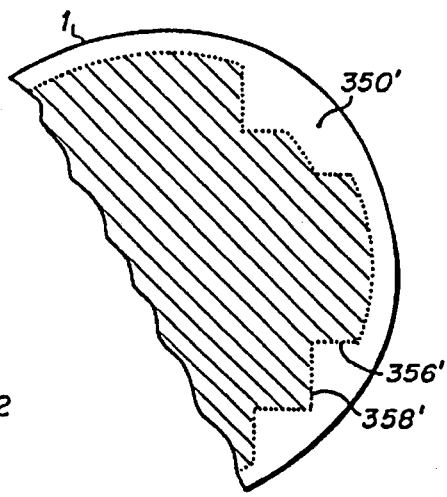
Fig_15b
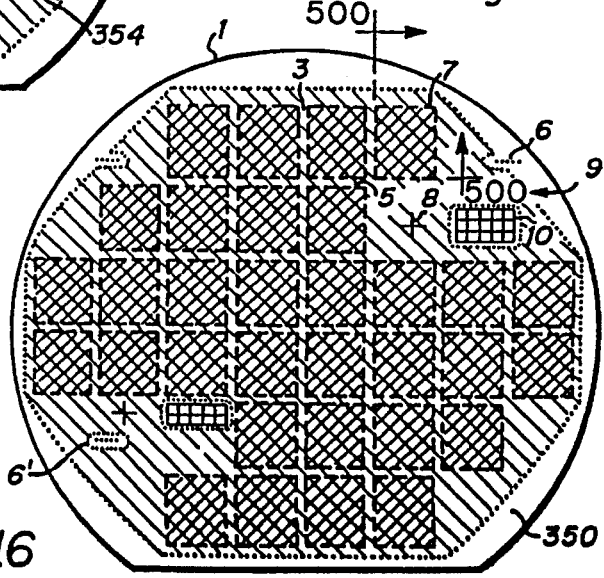
Fig_16

ADAPTIVE CONFIGURABLE GATE ARRAY

This is a continuation of U.S. patent application Ser. No. 07/933,442, filed Oct. 5, 1992, now abandoned, which was a continuation in part of Ser. No. 07/803,944, filed Dec. 9, 1991 (abandoned) which was a continuation of Ser. No. 07/416,635, filed Oct. 3, 1989 (abandoned).

REFERENCE TO RELATED APPLICATIONS

This application describes subject matter common to and is copending with application Ser. No. 07/960,496, filed Oct. 13, 1992, by the inventors, and application Ser. No. 07/959,590, filed Oct. 13, 1992, by the inventors, which are divisions of their application Ser. No. 07/651,068, filed Feb. 4, 1991, by the inventors, now U.S. Pat. No. 5,217,916, which is a division of their application Ser. No. 07/416,635, filed Oct. 3, 1989, now abandoned.

FIELD OF THE INVENTION

This invention relates to a method of fabrication of integrated circuit chips or semiconductor wafers and, more specifically, to a "master slice" method of fabrication of those integrated types of circuits referred to as configurable gate arrays and application specific integrated circuits formed of configurable gate arrays. The invention also relates to a master slice configurable gate array integrated circuit wafer of novel structure that is adaptive to any size of application specific integrated circuit chip, a true "one size fits all" gate array, and to apparatus and processes therefor.

BACKGROUND

Integrated semiconductor circuits may be supplied to the electronic equipment manufacturer in the form of a small "chip" of rectangular shape, more specifically referred to as a "die", for bonding into a suitable package that is then mounted in a circuit board. The die is the end result of a fabrication process, "processing", which, as viewed from a macroscopic level, begins with a wafer of high purity semiconductor material, the "substrate", typically a grown single crystal silicon from which the wafer was sliced, with the wafer being of a size sufficient to support a number of copies of an integrated circuit to be processed simultaneously.

For example, an upper surface area defined by a wafer of four inches in diameter and a thickness of 50 mils represents one standard wafer size in present commercial practice. Many Integrated Circuits fit within that space. Through a series of processing steps, which are known, involving oxidizing, masking, which may be of the photolithographic stencil like technique or of the more modern laser or electron beam pattern formation apparatus, etching, metallizing, impurity doping and deposition a pattern of a large number of semiconductor devices are formed on the wafer's surface. Typically the semiconductors are arranged in discrete groups about the surface of the wafer with the groups spaced from one another by border strips, an effective "no man's land" between the groups. The semiconductors within the group are sometimes referred to as "cells". And each group of cells, referred to as an integrated circuit or simply IC, is of a generally rectangular shape and essentially forms an integrated circuit that provides a function specified by the circuit designer. This overall function may be a "calculator chip" that functions as the circuit for a calculator, a "computer chip" that functions as the element of a computer, or a "display chip" that serves as the electronic circuit to process signals for a visual display as example.

By such fabrication technique, many copies of a desired electronic circuit represented in the group of cells constituting an integrated circuit are reproduced simultaneously in a single processing of one wafer, providing obvious production advantage. As one of the final steps in the fabrication process the wafer is subsequently "diced" or, as otherwise stated, "sliced" using a saw, into frangible rectangular shaped sections and broken apart, effectively cutting the wafer into prescribed corresponding rectangular segments or dies, each of which contains an integrated circuit. Each IC chip from the wafer is a monolithic integrated circuit that is intended to perform the predetermined electronic functions specified by the circuit designer as in the examples earlier stated when the chip is installed in a circuit board or other electronic apparatus.

An individual integrated circuit, referred to in the preceding paragraphs as a collective group of cells, as viewed on a more microscopic level, contains very large numbers of semiconductor devices, referred to as transistors, interconnected by electrical wiring as achieves predefined electronic functions that collectively attain the overall function that the IC is intended to achieve. The IC is said to be formed of "cells", transistors of one form or another, arranged in an electronic circuit. The simplest form of cell may be referred to as a "gate". In turn the gate typically includes four transistors arranged in two pairs which are electrically isolated from the next cell. At a more elemental level, the gate may consist of only two transistors when the conventional "sea of gates" approach is used in which electrical isolation is achieved by having an associated pair of transistors wired to the electrically non-conducting or "off" state permanently.

Of those cells there are two major classes, used in what is usually called application specific integrated circuits, "ASIC", that are commonly used to allow circuit, designers to place large numbers of logic circuits on a single or common large scale or very large scale, collectively "LSI", integrated chip. One of these classes or types of cells is known as a standard cell, wherein each logical function is implemented as a custom designed circuit which can then be placed anywhere on the chip and be wired to other functions, circuits or cells. This provides a real convenience as the designer does not need to develop all the cells needed for the IC design. In this standard cell approach, the sizes of the devices or transistors and the layout of the circuits are optimized for each logical function so that density and performance characteristics are nearly comparable to a custom designed chip.

In the standard cell type of IC all steps in the fabrication of the wafer or chip are "personalized" for each particular design. Thus if any significant changes are to be made to the design, an entirely new mask must be made for every step in the fabrication process and the fabrication must again begin from a bare semiconductor wafer.

In contrast to the standard cell, gate array cells, typically referred to as "macros" are not personalized until the fabrication process reaches the first contact level to the conductive material which interconnects the devices or transistors in the gate array. That is, a typical gate array chip is formed by making rows of P-channel and N-channel transistors, if complementary metal oxide semiconductor, "CMOS", technology is used, arranged in functionally generic cells on the surface of the chip. For each discrete logic function available in the library of macros, a "personality" of conductors is defined in a known manner which interconnects the devices or transistors located within one or more cells to perform a desired electronic function, such as inverting or latching. Fundamental logic circuits, the "macros", such as an invertor, AND, OR, NAND or NOR gates are formed with MOS FET's in one or in several adjacent basic generic cells. Any logical function implemented on the gate array chip uses the same set of "background" transistors or devices and, if any changes are to be made in the circuit, only the last few steps, the conductor and contact steps, in the fabrication process need to be altered.

This wafer processing technique is often referred to as the "master slice" technique, wherein a semiconductor wafer that is to contain many integrated circuits, as earlier described, is processed up to a defined step in manufacture and then is placed on hold in inventory as a "master slice" for later completion. The present invention redefines specific aspects of the master slice technique and creates a new form of master slice semiconductor wafer.

Of the different type of gate arrays available, the complementary metal oxide semiconductor, "CMOS", gate array is most widely used for LSI semiconductor devices. Heat created through power dissipation of the transistor poses a limitation in the quantities of transistors that may be packed onto a single substrate. CMOS transistors have the advantage of lower-power operation than other types and, therefore permits a higher degree of integration of the LSI semiconductor devices. The present invention also takes advantage of CMOS technology.

In this well known gate array or master slice semiconductor device, many basic elements thus are formed in a semiconductor chip prior to determining the function to be performed by the chip. Each basic element set is fabricated with typical transistors, resistors, and so on to form a basic circuit, referred to as a basic cell. Up to this point, the master slice semiconductor device is mass produced in large quantities. When a specific circuit function is subsequently identified, interconnecting lines are formed between the basic cells and in each basic cell using a specified mask to obtain an LSI semiconductor device containing the desired functional circuits.

Much like the modern housing developer acquires a large plot of land and partially builds a large quantity of houses of identical construction very rapidly at one time to achieve maximum construction efficiency and lesser cost and then "banks" or leaves the partially complete houses undone in inventory for later completion by subsequent installation of the floor coverings, wall coverings and window coverings after the specific home buyers needs are identified; whereby carpets or floor tiles, drapes or window blinds, tailored to the individual's wishes, are selected and installed, completing and effectively "customizing" the individual house in the group, so too the manufacturer of integrated circuit configurable gate arrays or other elemental transistor arrays for like reasons, but with greater complexity, also partially builds and banks in its inventory partially completed integrated circuit chips on wafers whose final construction and function, the "personalization" or "customization" of the pre-formed gate array, awaits identification of the chip buyers specific needs, whence final design and processing are undertaken and completed.

And like the developer who subdivides the land into pre-formed plots on which the buyer has no say, incidental to the sale of homes in the development, so too the semiconductor manufacturer assembles many gate arrays on a single wafer and then subdivides the wafer as individual "chips" or "dies" by slicing the wafer into many separate rectangular shaped parts.

By using the master slice gate array approach, both initial IC designs and later modifications to those designs can be obtained more quickly and cheaply than in a standard cell design or custom design, though with some impact to chip performance and density when compared to the standard cell and/or custom design chip. The technique enables significant reductions in both design and manufacturing time since one need only design and fabricate the specified masks when manufacturing a new semiconductor device.

Furthermore, since a large number of basic cells are regularly arranged in both the column and row directions on the semiconductor substrate and form a standardized matrix pattern in a master slice semiconductor device, it is very easy to employ computer aided automatic wiring to form the electrical interconnections.

Gate arrays are manufactured in fixed or standard sizes at present, approximately twenty to thirty different sizes. Each size requires an inventory of fixed size base arrays, made up of generic gates, or cells. An inventory of each size is maintained in the hope that most, if not all, of the IC designs that are presented to the fabricator will fit onto one of the various sizes of gate arrays in that inventory. As presently practiced in the industry, software routines perform essentially all of the macro placement and conductor routing for the given personalization. Such "place and route" procedure represents a significant cost in the procurement of a "personalized" gate array IC chip.

Often personalizations do not quite fit a particular master slice size. Consequently the personalization must be placed on the next larger size master slice. To do so often entails additional wire routing design expense. Further the number of personalizations available from the master slice will be less than is the case in which the master slice size fortuitously exactly fits the given design. By providing a master slice that is completely uncommitted to any particular die size, obvious economies are achieved. The present invention produces a configurable gate array wafer that eliminates the need for stockkeeping of different size master slice gate arrays.

A single integrated circuit die may next be considered in more detail as further background to the invention. The known gate array devices have a cell layout in which a plurality of basic cells are arrayed in rows and columns in the central portion and a plurality of input and output cells disposed in the peripheral portion surrounding the array. More specifically, each of the basic cells in one type of CMOS configurable gate arrays includes typically two N channel MOS FET's and typically two P channel MOS FET's. The N channel MOS FET's in each basic cell have an arrangement of a drain region, a gate, a source region, a second gate and a second drain region in the stated order in parallel with the row direction. The P channel MOS FETS in each cell are disposed at a portion adjacent to the corresponding N channel MOS FET's in the column direction and, similarly to the N channel MOS FET's have a drain region, a gate, a source, a second gate and a second drain region in the stated order in parallel with the row direction. The P channel MOS FETs in other basic cells in the same row are disposed side by side. The N and P channel MOS FETS are wired with the first layer wiring disposed over the N and P channel MOS FETS and second layer wiring disposed over the first layer wiring. In another conventional gate array, referred to as the "sea of gates", the MOS FET transistors have source drain regions, which are shared by the adjoining FETs. Although the transistors are not segregated into electrically isolated groups of four in the sea of gates structure and are in a continuum, a grouping of three pairs or six transistors in such an array may be regarded as a cell for purposes of explanation.

Reference to gate arrays and to prior literature concerning gate arrays is presented in the patents to Fitzgerald U.S. Pat. No. 4,742,383, Takayama U.S. Pat. No. 4,701,777, and Usui U.S. Pat. No. 4,771,327; and related information is presented in Percival U.S. Pat. No. 4,691,434, Schallenberger U.S. Pat. No. 4,766,476, Rowson U.S. Pat. No. 4,745,084, Varshney U.S. Pat. No. 4,703,436, Heath U.S. Pat. No. 4,688,072 and Furtek U.S. Pat. No. 4,700,187 and may serve as background for the interested reader.

Of particular note U.S. Pat. No. 4,733,288 granted Mar. 22, 1988 to Sato for a Gate Array Chip also illustrates a row and column arrangement of the gates in the configurable gate array. Moreover Sato recognizes a limitation in the existing master slice structure, noting that quite often an individual gate array contains many more gates than are needed in a given application; and since the surplus gates are unavailable to adjoining chips on the wafer, such surplus gates are effectively wasted due to the lack of necessary input and output type semiconductors. As noted by Sato, a conventional gate array LSI chip does not have any region for forming an input output "pad" in the internal area; and that it is thus not possible according to Sato to cut the integrated circuit gate array chip into a plurality of smaller sized chips.

To salvage these otherwise wasted cells for other application, which by themselves can form an independent IC, Sato proposes a design change that allows a standard chip to be modified and cut up into smaller parts, smaller dies, by cutting away some portions unneeded; much akin to saving "string" or a "waste not, want not" approach. To do so Sato requires that extra input output transistors be added to the extended gate array, such added transistors being different in structure from those transistors in the gate array used for logic functions, reasoning:

"The gate width of a transistor in an input buffer circuit, however, is narrower than the gate width of a transistor in the basic cell arrays, with the result that an input buffer circuit cannot be formed by the basic cells. To make it possible to form an input buffer circuit and a protective circuit, a bulk pattern, comprising an impurity diffusion region is formed under the surface of the wiring region between the basic cell row. The input output circuit region, in which the bulk pattern is formed, is adapted to be a source region or a drain region of a MOS semiconductor transistor or a base or emitter of a bipolar transistor in an input buffer circuit or a diffusion region of a protective diode in a protective circuit."

The Sato patent thus describes a technique to make the gate array chip using the master slice technique more versatile by slicing a given chip into several parts; slicing along paths between rows and columns of the basic cells, while leaving enough space between the cut border and the adjacent peripheral edge of the row or column of cells to allow for insertion or formation of additional transistor input output circuits distinct from the transistors in the cells that the Sato gate array arrangement requires.

With a saw that is thin enough so as not to extend across bordering rows (or columns) of gates, estimated as being spaced by about 10 mils on the horizontal direction and 8 mils along the vertical direction, the chip may be sliced between the adjacent rows, leaving enough room in the border area to form the additional circuits to serve the input output function. Essentially by adding more transistor devices the new structure proposed by Sato re-forms a conventional gate array of smaller size from one of larger size, with the gates surrounded by input output buffers of transistor construction different than the transistors forming the gates.

The present invention likewise provides a configurable gate array of greater versatility. The configurable gate array invention disclosed herein also requires input/output buffers as was the case in the Sato patent and the prior art. A decided advantage to the invention, however, is that the addition of diffusion regions in between rows of cells as found necessary to provide the input output buffers in the Sato gate array structure is not required.

Further, in the disclosed invention the input/output transistors are not required to be placed along the periphery of the gate array; they may be physically located anywhere in the array. In the invention the transistors used to provide that function are one and the same as other transistors in the array; the transistor types are not different. As a result the circuit design is made more efficient; the circuit designer no longer is bound to use only a specific group of transistors as the input/output function which restricted the wiring paths.

Conventional technological wisdom as evidenced in the cited patent literature and in the applicant's prior experience was that the layout of elemental cells was made in an array of rectangular geometry with a group of the cells, a row and column of cells, sufficient in number to form the customer identified integrated circuit complete with bonding pads and input/output circuits surrounding the macro cells, and to form as many such groups on and distributed over the available wafer surface with sufficient spacing or boundary between each array, spacing identified by the incorporation of straight "scribe lines" or saw lanes formed on the wafer surface, allowing the wafer to later be "diced" to remove the individual chips, the "dies"; as accomplished by slicing the wafer along those scribe lines.

In this conventional wafer processing technique the scribe lines were formed on the wafer either prior to or concurrently with the formation of the plurality of arrays as choice incidental to the layout of the several integrated circuits on the wafer, since adequate spacing between the many gate arrays on the wafer was provided to allow for slicing in the prior process. The lines were visible to the operator. The operator could thus align the saw to the position of dividing space, set the equipment and allow it to slice automatically, without requiring the addition of a paint or other marker in the channel, but which could be added to enhance the scribe line as desired.

The present invention also uses saw lanes or scribe lines to like advantage. A characteristic distinguishing the invention from such prior fabrication process is that scribe lines are made only after formation of the transistor cells on the wafer; more specifically, scribe lines are formed over and extend across rows and/or columns of transistors that were formed on the wafer in the preliminary wafer processing steps. The present invention effectively does not incorporate border areas at the gate level, the areas between individual gates or cells being effectively borderless in the sense of the prior devices. The borders are formed only during the process of personalizing the gate array.

By analogy to the home developer as above, it would be like the home developer personalizing the house further, beyond carpets and drapes, by allowing the buyer to add rooms and special gardens, which takes up more land, as an added feature to some of the homes; only thereafter dividing the land on which the homes sit into odd shaped lots, instead of regular shaped lots, according to the need after the final shape of the home and gardens is finally determined.

As those skilled in the art quickly surmise from the foregoing statements regarding the scribe lines, the present invention also incorporates a slicing step, one which illustrates a further characteristic to the invention; slicing the wafer along the afore described scribe lines, and completely destroying, if not obliterating, the rows and/or columns of elemental transistor gate cells underlying the slicing path, which are expended thusly in attaining the benefit which the disclosed invention provides. In contrast to prior teachings, such as presented in the Sato patent, a benefit of the invention comes from destroying individual gate cells, not by saving unused ones.

By spreading transistor gates over the entire wafer surface any configuration of a gate array, typically arranged in a rectangular pattern, may be "mapped" or fitted onto a single wafer in multiple copies, eliminating the need for different wafers with different standard size gate arrays. By employing arrangements of some of those same transistors as input and output circuits, to be formed during the personalization of the integrated circuit formed from the array, no additional special transistor fabrication is needed for those functions.

In as much as the greatest hurdle to introduction of new integrated circuit designs is to surmount the "up front" set up and design costs, the present invention makes new designs easier and quick; hence reduces the cost of introducing new integrated circuit designs and allows for more rapid introduction of new chips of benefit to the user.

In accordance with the foregoing, an object of the invention is to provide a configurable gate array that is of more versatile application in the formation of integrated circuits; to realize a configurable gate array that is adaptive to integrated circuits of many sizes; a nearly continuous spectrum of sizes.

Another object of the invention is to provide a master slice gate array wafer or master slice which eliminates the need for pre-formed boundaries between the individual transistor cells in the array and thereby supports fabrication of all sizes of ASIC chips; a gate array master slice which is considered variable in size, essentially providing a "one size, fits all" configurable gate array which permits greater efficiency in the production of semiconductor integrated circuits;

Still another object of the invention is to provide a new process for fabricating ASIC chips of any size that requires only a single size of configurable gate array as an essential starting ingredient, and to provide lower cost of low volume ASIC chip requirements and quicker turn around time in designing and fabricating ASIC chips;

An additional object of the invention to lower the cost of design and production of new integrated circuit designs while maintaining the quality of the circuits produced; to allow production of logic products of optimal density and enhance the ability to implement rapid turn around time for design changes in and for new designs of such logic products;

A still further object of the invention is to eliminate the necessity of maintaining an inventory of different sized configurable gate array chips, thereby reducing manufacturing and stocking expense and permitting manufacturing quality to be enhanced by limiting the size of arrays to be manufactured to a single size;

An ancillary object to the invention is to release "place and route" software from the heretofore existing constraints of chip size boundary conditions and allow development of new more efficient software such as the place and route function which could be designed and operated more quickly than heretofore possible; and An ancillary object to the invention is to provide reinforcement structure to minimize crystal fracture during sawing of a semiconductor wafer as increases yields of functional chips and/or permit increased packing of transistors on the wafer for increased density.

SUMMARY

A configurable gate array, useful in the construction of application specific integrated circuits, ASIC's, comprises a wafer of semiconductor material to provide a substrate for an application specific integrated circuit with said wafer; a processing means, such as an alignment marker or markers, occupies a small predetermined portion of the wafer surface, with such portion being substantially smaller than the wafer's surface area; a large plurality of transistor gates are formed in the wafer and are arranged in rows and columns uniformly dispersed throughout a substantial portion of said wafer surface, exclusive of the predetermined portion of said surface occupied by the processing means, with the continuity of said respective rows and columns being interrupted, if at all, by said predetermined portion occupied by the processing means.

Effectively the wafer provides a surface that is covered by a virtual "sea of gates" with small patches or "islands" in that sea. Those islands are occupied by alignment markers, by test circuits and/or by first wiring level semi-custom circuits. With a master slice so fashioned, individual integrated circuits are carved out from the "sea" upon completion of processing.

In another aspect the invention presents an improved process for making an integrated circuit chip of the configurable gate array type from a wafer assembly containing, below the contact and wiring levels thereof, a plurality of transistor gates of uniform structure arranged in a plurality of spaced rows and columns, that includes the step of sawing the wafer along a plurality of straight paths or lines with said lines being located in overlying relationship with at least two non adjacent rows of said plurality of rows of gates and at least two non adjacent columns of said gates so as to obliterate or destroy the gates underlying said respective rows and columns and to define at least one rectangular shaped die containing an application specific integrated circuit, the structure of which as viewed below the contact and wiring level includes a portion of said remaining gates.

In a further aspect the invention is characterized by a process to form an application specific integrated circuit chip in a series of steps including: forming a configurable gate array on a semiconductor wafer, with the array containing a plurality of transistors arranged in rows and columns; personalizing the array to define at least one application specific integrated circuit located in a rectangular shaped area of said wafer, with such rectangular area containing a portion of the rows and columns of said array, and with such personalizing including the wiring of selected ones of said transistors within said rectangular area to define with the selected transistors input and output circuit functions; and slicing the wafer along other rows and columns of transistors located adjacent to the aforementioned rectangular shaped area to functionally destroy the transistors underlying said rows and columns and to define at least one rectangular shaped die that is frangible from said wafer, with such die containing an application specific integrated circuit. Preferably, such personalization also serves to define the scribe lines along which the slicing is made.

In a more specific feature to the invention, individual saw lanes or scribe lines, as variously termed, in which the slice is made is in the form of a channel. The side walls of such channel include a metal material as a cladding. Preferably, the metal cladding is formed during the processing of the wafer incident to the formation of the outer metal contact layers in personalizing the gate array to form the intended integrated circuits. Suitably, the width of the channel is at least as wide as the saw that is later used to slice the wafer, approximately two mils in width in saws currently available for this application, although thicker saws may be used.

It is found that the described channel shaped scribe line structure has the advantage of reinforcing the wafer, which is a crystal material, suitably a silicon single crystal, along the cutting path in which the wafer is sliced so that the crystal does not fracture in lines that traverse the surface from points adjacent the saw's path as sawing occurs as might unintentionally destroy other transistors adjacent to the slicing paths. Consequently, with the reinforcement the distance between the slice and the row of transistors adjacent that slice may be held to an absolute minimum, enabling effective implementation of the invention as well as having beneficial application to other operations beyond the present invention.

Other aspects to the invention include a new structural relationship as presented in the bonding pad, which is of a bumpy surface contour. The invention includes a novel configuration for input and output buffers in which the buffer transistors are identical with other transistors of the gate array. And a masking process in which a step and repeat type of masking apparatus is modified to include intelligence as permits avoidance of alignment markers in defining integrated circuit mask patterns on the wafer surface.

The foregoing and additional objects and advantages of the invention together with the structural characteristics thereof, which was only briefly summarized in the foregoing passages, becomes more apparent to those skilled in the art upon reading the detailed description of a preferred embodiment of the inventions, which follows in this specification and in the appended claims, taken together with the illustration thereof presented in the accompanying drawings.

DESCRIPTION OF THE DRAWINGS

In the Drawings:

FIG. 1 illustrates in top plane view a wafer formed according to the invention with the wafer in a condition ready for dicing into individual dies, each containing an application specific integrated circuit, ASIC;

FIG. 2 pictorially illustrates a single die containing a monolithic integrated circuit ASIC obtained following dicing of the embodiment illustrated in FIG. 1;

FIG. 3a is an enlarged not-to-scale pictorial top view of the chip of FIG. 2 in which the upper layers are removed to permit view of the lower layers containing the configurable gate array with the cell elements of the latter represented by small rectangular shaped symbols;

FIG. 3b pictorially illustrates to a larger scale the arrangement of transistors in a row of cells taken from FIG. 3a, in which each cell includes two rows of transistors;

FIGS. 4a–4c, FIG. 4a illustrates to a larger scale a top view of a basic cell incorporated within the configurable gate array of FIG. 3, FIG. 4b shows the same cell pictorially, including the inter-element wiring to define a logic gate, and FIG. 4c schematically illustrates the gate of FIG. 4b;

FIGS. 4d–4f, FIG. 4d shows to an enlarged scale in a section of the gate array exemplary wiring patterns connecting selected transistors, graphically illustrated, in underlying layers in the gate array to form a horizontal output buffer and the associated wiring pad; FIG. 4e shows the buffer represented in FIG. 4d in schematic form; FIG. 4f illustrates the wiring pattern to define a vertical output buffer used in the preferred embodiment;

FIGS. 4g–4i, FIG. 4g shows to an enlarged scale exemplary wiring patterns connecting selected transistors, graphically illustrated, in underlying layers in the gate array to form a vertical input buffer and the associated wiring pad; and FIG. 4h illustrates the vertical input buffer in electrical schematic form; FIG. 4i shows the wiring pattern that defines a horizontal input buffer circuit used in the preferred embodiment;

FIG. 5b illustrates a section of a wafer prior to formation of the gates in the process of FIG. 5a and FIG. 5c illustrates the same section following the formation of the gates;

FIGS. 6a–6b, FIG. 6a illustrates in section view a single transistor in the array; FIG. 6b illustrates a section view of the chip taken along the lines B—B in FIG. 5 to show the channel structuring defining the scribe line and the reinforcing walls ready for slicing;

FIG. 7 shows an alternative layout for processing the wafer in which arrays of different size are formed on a single wafer;

FIG. 8 shows the pattern arrangement on a master slice used by a step and repeat optical masking apparatus;

FIGS. 9 and 10, FIG. 9 shows an additional alternative for processing the wafer using multiple optical alignment targets necessary for optical step and repeat type masking equipment and FIG. 10 shows a layout arrangement corresponding to that of FIG. 7 using a wafer containing the multiple optical alignment targets;

FIGS. 11b and 11c together present a flow chart describing the novel process and apparatus by which the apparatus of FIG. 11a is adapted to the practice of the invention;

FIG. 13 illustrates an alternative form of the wafer of FIG. 1 in which alignment markers are situated within small voids or islands on the wafer;

FIG. 14 illustrates a still additional form of the wafer of FIG. 1 containing border areas of significant size that are void of transistors;

FIGS. 15a–15b, FIG. 15a partially illustrates the form of the wafer of FIG. 14, containing border areas, as such wafer appears at the same stage of production as the wafer of FIG. 5c and FIG. 15b illustrates another version of such wafer; and FIG. 16 illustrates an alternative form of the wafer of FIG. 14 that was modified to also incorporate the same alternative for the location of alignment markers in islands as was used in the wafer of FIG. 13;

DETAILED DESCRIPTION OF THE PREFERRED EMBODIMENTS

Figures 5, 5A, 5B, 5C:
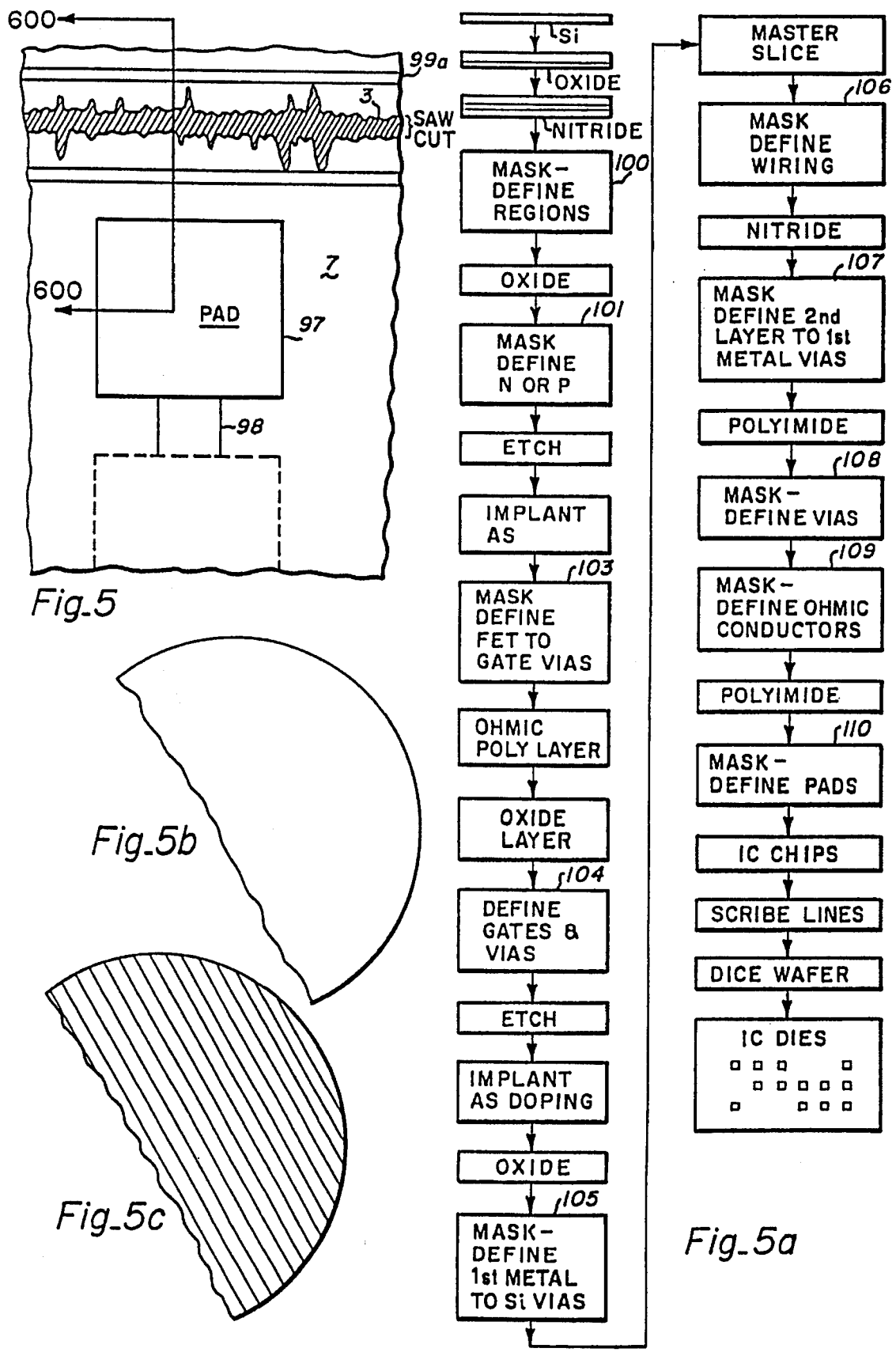
FIG. 5 shows in top view a section of the chip of FIG. 2 to a large scale and pictorially depicts the portion of the transistor gates destroyed in the slicing procedure.
FIGS. 5a–5c, FIG. 5a illustrates in diagrammatic form the steps of the process for making the embodiment of FIG. 1.

Reference is made to FIG. 1 in which a wafer 1 constructed according to the invention is illustrated in top view. As represented graphically by shading lines tilting to the left, a substantial portion of the surface is covered with transistor devices or, simply, transistors. The wafer contains a number of spaced parallel vertically extending scribe lines 3, only one of which is labeled, defining vertical lines and a number of spaced parallel horizontally extending scribe lines 5, only one of which is labeled, defining horizontal lines with the lines defining rectangular shaped areas 7 on the wafer, indicated graphically by additional shading lines extending at a 45 degree angle to the right, only one of which is labeled, with thirty two such areas being illustrated in this embodiment. Each of the rectangular shaped areas represents a single ASIC chip, a monolithic integrated circuit, that is formed of a configurable gate array using the novel master slice technique as is more fully described hereinafter. The surface of the wafer has a non flat topology, characterized as "hilly" or "bumpy" typical of MOS technology, not illustrated in the figure. Further, the exposed electrical contacts are not illustrated in this figure for purposes of clarity of illustration. As depicted the wafer is in the form or configuration that follows the completion of electro-chemical processing and contains the application specific integrated circuits, ASIC's, formed thereon represented by the rectangular areas, with the wafer is ready for slicing along the scribe lines and subsequent dicing.

A portion of the surface of the wafers surface is taken up by alignment markers, such as 6 and 8, which are located at two different points. The markers may overlie formed transistors, as shown in FIG. 1, or may exclusively occupy that portion or "patch" of surface, which is devoid of transistors as illustrated in FIG. 13, discussed later. The alignment markers, as is typical in the semiconductor industry, are normally provided to facilitate and permit aligning the subsequent masks or reticules to the wafer at each of the various patterning steps in the wafer fabrication process.

In as much as this first embodiment was processed using the full field optical technique of mask formation, a known technique, few alignment markers are required. However, in alternate embodiments, such as those in which the step and repeat type mask formation technology is used instead, more alignment markers are required; the markers in that instance occupy a greater area of the wafer surface and wafer processing increases slightly in complexity as brought out in greater detail hereafter in connection with the discussion of alternate embodiments. In all embodiments the portion of the surface occupied by the alignment markers, as may be referred to generally as processing control devices, and the discontinuous areas in total is as illustrated small and less than substantial. The gate array of transistor devices occupies a substantially larger portion of the wafer surface.

As those skilled in the art appreciate, in addition to the alignment markers other processing control devices, such as indicated at 10, may be included on the wafer and occupy some space on the wafer without departing from the invention. Such control devices may include a test integrated circuit or a testing integrated circuit, one which is used to evaluate the characteristics of the ASIC devices formed on each wafer prior to detachment of the wafer into individual dies. The amount of space occupied by such test integrated circuits, alignment markers and other processing control devices remains small, may be regarded as insubstantial.

The embodiment illustrated in this figure contains a quantity of thirty two integrated circuit chips; and those chips are of identical structure and purpose. However, in different embodiments brought out hereafter, different numbers of different size chips of different structure may be formed to provide an assortment of integrated circuits on a single wafer. The remaining or unused portions of the wafer, labeled 9, though containing transistors, are essentially waste or scrap and may be discarded. Scribe lines 3 and 5 are of a special structure in accordance with an additional aspect to the invention referred to in the preamble to this detailed description and that structure is described in greater detail subsequently in connection with FIG. 6.

Given the wafer of FIG. 1, the wafer is then sliced and the individual square or rectangular pieces defined are detached into individual "dies" by slicing along the scribe lines, accomplished with a conventional rotating "saw" used in the industry for slicing semiconductor wafers, and breaking apart the wafer. An individual one of the rectangular sections, 7, is better represented to an enlarged scale in FIG. 2 to which reference is made.

In this somewhat pictorial top view rectangular segment 7 appears as an independent die following the step of slicing and is separated from adjacent circuits and from waste portions 9. Like chips of the prior art the integrated circuit is fabricated in layers: The uppermost layers contain the inter element wiring to form a function for the chip overall and the intra element wiring, which forms the underlying transistor element into a logic gate or other macro as is known in the art; with the elements collectively defining the configurable gate array, the underlying quantity of transistors, being in the lower-most layers, usually the first five layers of a ten layer assembly. By considering the upper layers as having been removed and considering only this one rectangular portion of the wafer previously discussed, the configurable gate array within this chip may be pictorially illustrated to a larger scale in top view as in FIG. 3a to which reference is made.

As there shown in FIG. 3a, integrated circuit chip 7 contains a plurality of cells 11, only some of which are represented. These cells are arranged in rows 13 shown extending horizontally and in spaced parallel relationship to one another, with each cell representing the operative functional "gates" incorporated therewithin. Viewing the cells along the vertical axis, the cells in adjoining rows form vertical columns, 15, with the columns spaced from one another, representing the electrical isolation between individual cells as is provided for and is formed during the initial stages of wafer fabrication. The cells are identical to one another in accordance with the invention, as well as being identical to all the cells contained within the other chips formed in the wafer of which this one rectangular 7 segment is representative. Further the cell constitutes structure that is the same as those of any prior art cell element, such as a macro or a gate; with the gate comprising eight transistors, as used in the preferred embodiment but which in other alternative embodiments could contain hundreds of transistors, six transistors, four transistors, two transistors or even a single transistor.

A portion of one row of the transistors of FIG. 3a is pictorially illustrated in FIG. 3b, which as shown contains groups of eight field effect transistors, MOS FET, four of which 14a, 16a, 18a and 20a are P-channel type as represented by the letter P and four of which labeled 14b, 16b, 18b and 20b, are N-channel type as represented by the letter N arranged in four pairs, consistent with the "sea of gates" approached used in a preferred embodiment. As those skilled in the art appreciate other transistor structures may be substituted without departing from the teachings of this invention. In the isolated cell approach as may be used in an alternative embodiment, the cells may be arranged in a group of four transistors 14a, 14b, 16a and 16b, symbolically covered by the same illustration.

For purposes of this specification and the appended claims, both N-type and P-type transistors are interpreted or deemed to be substantially identical in structure. As is apparent, the invention is not dependent upon the different "doping" used to categorize or type the transistor into N or P type and for all practical purposes they may be considered as the same in these processes. A better mechanical depiction of the individual cells is presented in FIGS. 4a and 4b to which reference may be made.

As depicted to a greatly enlarged scale and in mechanical form in top view in FIG. 4a, the P channel transistors 14a, 16a, 18a and 20a have a source/drain region 21 and a gate electrode such as gate 23. The source/drain region is formed of P-type diffused regions 21 formed in an N-type silicon substrate and the region 27 is N– type diffused. The gate electrodes may be of polysilicon disposed on the substrate between the source/drain regions overlying an insulator film of native oxide. The N– type transistors 14b, 16b, 18b and 20b are formed in a P– type well region 31 formed in the substrate as is conventional structure. This latter contains a source/drain region 27 and a gate electrode 29. The source/drain regions are made of N– type diffusions formed in the P– type well. The gates also may be of polysilicon. Typically a gate of six transistors may occupy a space of 0.5 mils by 3 mils.

The physical separation between the ends of elements 18a and 18b in one practical embodiment is on the order of two microns; and that distance between 16a and 18a is on the order of twelve microns. It is small; significantly smaller than the two mil saw thickness used to slice the wafer.

FIG. 4b illustrates a typical layout of a 2 input nand logic gate formed of the elements presented in FIG. 4a to which wiring layers are applied. Power line 40 for positive voltage is formed with a first layer metal and runs over the P channel transistors insulated by an insulating film, not illustrated in the figure. A second ground line conductor, 41 is also formed with the first layer metal and runs over the N channel transistors via the first insulating film. A typical cell is formed with first metal layers, represented by the "dotted" crosshatching; the second metal layer is not shown and is not used in this layout and the contact vias are represented by small solid black squares. One of the inputs is labeled 26, its contact to the P channel transistor gate, 16a is labeled 24 and the other input is labeled 28. The output metal is labeled 20 and the contact to the P-type drain is labeled 22. Transistor gates 14a and 14b are tied to their respective electrical voltage sources to maintain them in the electrically "off" state during use. The same is true for transistor gates 20a and 20b. Electrical isolation between adjoining cells is provided by the space between the source/drain regions 21 and the spaces between the P-well regions 31.

The foregoing arrangement is illustrated in schematic form in FIG. 4c. The input and output connections are denominated by the same number used to identify that element earlier in FIG. 4b. Transistor gates 14a, 14b, 20a and 20b are not shown in the schematic representation of FIG. 4c for clarity. Element 30a is a contact to the N+ type diffusion region 31a into the N-type bulk Silicon, a conventional means of securing the proper electrical bias of the bulk region. Similarly, contact 30b serves as electrical contact into the P+ type diffusion 31b within P-well region 31. This also is a conventional means of maintaining proper P-well electical bias via metalization 41.

FIG. 4d illustrates the layout and wiring of a horizontal output buffer according to the invention formed of transistors in one integrated circuit constructed from the configurable gate array. FIG. 4f illustrates the layout and wiring of a vertical output buffer. Electrically, these two buffers are identical. The vertical and horizontal connotations are some what arbitrary and refer to the orientation of the bonding pad, 80a and 80b, relative to the buffer wiring and underlying transistor gates. These two orientations are needed for the simple reason of being able to place output buffers on both the vertical and horizontal sides of a chip. It is typical to place bonding pads and related interface circuitry along the sides of a chip layout. Both of these buffers, as is also the case with the input buffers which are described later, may be reflected about the vertical axis of the page on which they are presented here. Thus, the same layout will serve both the opposed sides of a chip. For example, if the base transistors are oriented vertically as reference, then the buffer shown in FIG. 4f can serve the left side of a chip and by simply placing it reflected about the vertical axis, it will serve the right side of the chip as well. Similarly, the buffer shown in FIG. 4d can serve both the top and bottom of a chip. This reflecting of macros, or more generally speaking cells, is common practice in layout of all types of integrated circuits. The transistor gates and contacts are recognizable in FIGS. 4d and 4f from descriptions of same in FIGS. 4a and 4b. The bonding pad, 80a and 80b which is second level metal (commonly referred to as metal 2) is tied to the output of the buffer by first level metal, 82 in FIG. 4f (commonly referred to as metal 1) through vias, 81a in FIG. 4d and 81b in FIG. 4f. The output of the buffer is formed by tieing 8 NMOS base transistors in parallel and 8 PMOS base transistors in parallel in such a fashion as to have all the drains in common, 84, by metal 1 and contact, this common drain being the output node of the buffer. All 16 of the transistor gates are tied in common, 85, with metal 1, and thus form the input to this the ultimate stage of the buffer. This last stage is driven from the drain 83a, of the preceding stage which is the input stage of the buffer. The input stage is formed in the same fashion as the output stage except that only two base transistor pairs are used instead of eight. The input node of the entire output buffer macro is formed on metal 2, 86a, FIG. 4d and metal 1, 86b, FIG. 4f. This is a typical design practice in integrated circuit design.

FIG. 4e presents an electrical schematic of the two buffer configurations described in the preceding FIGS. 4d and 4f.

FIG. 4i illustrates the layout of a horizontal input buffer according to the invention formed of base transistors in one integrated circuit constructed from the configurable gate array. FIG. 4g illustrates the layout of a vertical input buffer. Electrically, these two buffers are essentially identical. As with the output buffers described earlier, these two different connotations, the two orientations of the bonding pad, 90a and 90b are needed to place the input buffers along the edges of the chip.

FIG. 4h shows an electrical schematic of these two input buffer configurations, except for the RO resistor which is present only in the vertical input buffer. In the vertical input buffer RO functions as a so called pull-up resistor, which is well known in general practice and is in common use in input buffers that interface with other integrated circuits that have so called open emitter or open drain output buffers. The RO can be seen in FIG. 4g and is formed by joining together in circuit 4 base gates tied end to end the first of which, 91, is tied to the metal 1 line, 92, that is connected to the pad, 90b, with the gates providing the appropriate electrical resistance characteristic desired. The electrical design of the buffers is typical and found in general practice. The buffers include a means of electro static discharge (ESD) protection which is formed by D1, D2, D3, D4 and R1 as seen in the schematic of FIG. 4h. The gate of D1 is labeled 93a and 93b, respectively, in FIGS. 4i and 4g, the gate of D2 is labeled 94a and 94b, respectively. R1 is composed of a P-type diffusion, 95a and 95b, tied in series with an N-type diffusion, 96a and 96b.

As the more skilled reader appreciates the foregoing description takes one from the large scale level through down to the more microscopic level as enables a full appreciation and understanding of the invention and its differences from existing structure and process.

The preceding pictorial illustrations illustrated only the functional transistors. There are, however, attached to peripheral edges of the chip die initially presented in FIG. 2 portions of transistors that were destroyed in the step of sawing or slicing the wafer. To better illustrate those destroyed portions mechanically FIG. 5 illustrates to a greatly enlarged scale a partial section of one edge of the die 7 taken along lines A—A in FIG. 1 along scribe line 3. Although not separately identified, the entire section 7 is covered by transistors of the type earlier described over which bonding pad 97 is formed; and connect wiring 98 is formed that extends to the macros. The scribe line is formed between the metal strips 99a and 99b, each comprising first and second metal, on each side of the saw lane. Although the groove cut is uniform for the most part essential equal to the thickness of the saw used to form the cut, chipping does occur and is illustrated. It is understood however that obliterated transistors effectively border the periphery of this die as well as the other dies cut from the wafer of FIG. 1.

No electrical disorder is created by the destruction of transistor devices underlying the scribe line. As described from FIG. 4a, the NMOS devices are grouped into P-well regions, which are electrically reverse biased in use by appropiate circuit implementations. Such reverse bias effectively insulates the destroyed devices from the surrounding bulk regions.

The P-well regions within and near the scribe lines may not be used for any electrically active purpose and are thereby regarded as inactive, having no physical connection to the active P-well regions within the chip other than through the bulk material. Hence destroying the inactive region by sawing and franging therethrough should have no adverse effect on the active P-well regions.

Those skilled in the art readily recognize that the foregoing structure functions irrespective of the polarity of the regions; that is, the arrangement described for P-well diffusion in N-type bulk material is equally applicable to N-well diffusion regions in P-type bulk material, wherein the N and P polarity notations are reversed. In the most general sense, no diffused regions may be electrically active, such as reverse biased, which are to be situated in or reasonably near the scribe lines or bonding pads, three to five mils or less as example. However, diffused regions that are of the same donor type as the bulk material are, by that relationship, electrically tied to the bulk material. As a consequence, even when sawed, franged, cracked or otherwise mechanically abused or damaged by any other means, that occurs when such regions are located in or near the scribe lines or bonding pads, such diffused regions can have no adverse effect on the active regions of the chip.

At this juncture in this description of the structure, it is convenient to describe the fabrication process. The new process for fabricating an application specific integrated circuit and the master slice configurable gate array described overall in FIG. 1 is based in large part on known standard processing techniques modified to meet the present requirements and is illustrated in the process diagram of FIG. 5a. Specifically the complete application specific integrated circuits are formed from the configurable gate array using the master slice technique and the master slice configurable gate array wafer are formed in layers. These layers and fabrication steps are only briefly summarized at this point in the description for completeness and as background to the novel steps characteristic of the disclosed invention.

Turning to FIG. 5a a raw silicon chip is first coated with or has formed thereon an oxide layer, as is typical, and then a nitride layer. This is pictorially represented by the partial section of blank wafer illustrated in FIG. 5b. A photo-resist mask 100 defines where the nitride is etched away; the nitride remains on areas that become channel regions for the FETs. In prior art processes this mask also defines the borders between the individual gate arrays and defines scribe lines on the wafer surface. The present invention departs from that aspect of the process was elsewhere herein described and gates are formed throughout the surface. At this stage the wafer is represented in a partial pictorial top view of FIG. 5c in which the presence of the formed gates atop the wafer is depicted generally by the diagonal lines as earlier used in the illustration of FIG. 1. At this time a boron field implant raises the threshold voltage of unwanted parasitic FETs so that they will never conduct. Mask 100 defines the source, drain, and channel diffusion bodies of the individual FET devices. In those regions of the surface not covered by the nitride, the oxide layer is then regrown to a greater thickness. The nitride and enough oxide are then removed to expose the silicon underlined in the channel regions, and a thin oxide layer is regrown.

A photoresist mask 101 defines which of the FETs are to be N− type and leaves open the channels of the N devices, and implanted arsenic ions convert only those channels to depletion mode for the FET devices. A mask 103 defines the various contact "vias" for connecting the FET bodies to the gate regions and defines varied contact areas formed by etching away the thin oxide in those areas of the channel exposed by the mask 103. A polysilicon ohmic conductive layer is deposited, and another oxide layer is formed thereover. These two layers are etched with a mask 104 which defines the polysilicon FET gates to define the gate electrodes. The polysilicon material also extends through the oxide holes previously defined by mask 103 to form the actual varied via or electrical load. Arsenic is implanted through the thin oxide around the gate in the channel, to provide N+ doped source and drain electrodes for the FETs, usually called the "diffusion layer". An oxide layer is then deposited over the chip. At this stage the master slice is complete and the master slice may be stockpiled pending personalization as is customary.

Personalization begins with a mask 105 that defines contact vias for connecting first metal to polysilicon and vias from first metal to diffusion. A mask 106 that defines ohmic conductors, such as aluminum, copper, silicon or similar metal, for wiring both inside the cells and between cells to form macros and also for intermacro wiring. The conductors can be defined either by deposition, masking and subtractive etch; or by masking, deposition and lift off of unwanted metal; and/or any other conventional process. A nitride is then deposited on the wafer, and a mask 107 defining vias for second metal to first metal defining the vias through this second layer to first metal conductors and also to the foregoing vias to even lower layers. A thick polyamide layer over the nitride reduces the capacitance between first metal conductors and the second metal conductors. A mask 108 defines vias through this polyamide layer in the same position as those vias formed in the nitride layer beneath. A further mask 109 defines ohmic conductors in the same manner and composition as the first metal layer to form the second metal layer conductors. These latter conductors link up the vias to provide intercell wiring as described elsewhere. It is noted that, alternatively, all intracell and intramacro wiring may be achieved totally within the first metal layer so that the second metal layer is free to run anywhere on the chip. Finally a second polyamide protective layer is laid down, and a mask 110 defines vias for connecting off chip terminals such as solder ball or contacts which are conventional. The processed wafer is then complete for all practical purposes and is in the form earlier represented and described in FIG. 1.

As the last step in the formation of the chips presented in FIG. 5a there is generally referred to by the block labeled "dice wafer". The channels earlier described in connection with FIG. 1 form scribe marks. The factory personnel then move a rotating saw along the scribe lines to slice the wafer. The wafer is sliced to a predetermined depth, typically one fourth the thickness of the wafer so as not to sever the individual chips at that time, but make them frangible, that is, capable of being easily detached or broken apart much like removing squares of chocolate from a chocolate candy bar. In practice the back of the wafer so sliced is then placed onto a piece of adhesive film which adheres to the wafer. This assembly is then placed in between sheets of paper and a cylindrical metal rod is rolled over the assembly first in one direction and then in the other, much like a baker's rolling pin. The pressure exerted by the bar is sufficient to break the wafer into the rectangular chips called dies; the dies are collected in one location in that manner, avoiding the scattering and possible damage as would occur were the wafer completely cut through in the slicing operation.

As presented in the enlarged partial section view of FIG. 6a the configurable gate array master slice contains a large number of FET cells only one of which is illustrated in a not to scale presentation, particularly distorted in the vertical dimension for clarity of explanation. The bulk silicon wafer 1 includes a formed P-type source or drain electrode 31, an N-type source or drain electrode 33, separated therefrom by an oxide channel 35. A polysilicon layer serves as the gate electrode 37. A deposited insulator 41, illustrated in FIG. 6a, and 41 in FIG. 6b overlies the other elements and serves as a protective layer while the master slice is stored. An opening 39 provides a passage for a contact, the ohmic connection to the source/drain and polysilicon in the case of FIG. 6a, formed when the assembly is personalized. The section is representative of the elemental transistor cells throughout the wafer, including those in the adjacent rows and columns.

Reference was made earlier to the scribe lines 3 and 5 in FIG. 1 as being of a channel shape. This is presented in greater detail in the enlarged partial section view of FIG. 6b depicting a portion of the wafer following personalization of the master slice. As shown in a not to scale illustration there is formed partially in and on the silicon layer 1 the various individual cells earlier illustrated in the section view of FIG. 6a, prior to personalization in the master slice configuration, each of which includes the P-electrode 31', the N-type electrode 33' the oxide 35' and the gate electrode 37', the numbers corresponding to those earlier presented which are in FIG. 6a, primed. Personalization adds the first dielectric 41, the first metal 43, the second dielectric 45 the second metal 47, a portion of which serves as a contact "pad", and the passivation layer 49. The corresponding elements to the left of centerline 51 are not labeled and will be recognized by those skilled in the art.

Element 47 is metal and appears on two sides. The passivation layer 49 is typically of deposited glass.

During the personalization of the wafer, metal 47 is deposited in place. Corresponding elements appear to the left of centerline 51 in the figure and need not be labeled or explained. The topology shows the surface of the wafer following personalization to be quite bumpy or hilly. And a channel is formed between the two semiconductor chips to the left and to the right about centerline 51. This is a well defined channel or line. A further mark may be placed on the surface over the path in the center of the well to enhance the visibility of the scribe line and its function. As represented by invisible lines 53 in the figure, a groove is cut or sliced into the surface of the wafer, to a depth of approximately one quarter of the wafer thickness. The saw is thin, suitably 4 mils, and its thickness is less than the distance between the rows of cells, typically 8 to 10 mils, leaving a portion of the wafer surface between the sides of the earlier formed channel. As also indicated the material removed during slicing to form the groove includes the transistors cells located along the centerline, two of which, 46 and 48, are shown.

The channel arrangement is found to provide important reinforcement to the crystal material. The crystal does not fracture during slicing. The metal walled channel thereby protects the physical and functional integrity of the adjacent transistors. Those skilled in the art appreciate that while this scribe structure has advantage as part of the disclosed combination, its use is not so limited and that structure may be used to advantage in other combinations as well. For example in other devices where adjacent components are deliberately spaced a distance apart as would allow for some sideways fracture in the crystal during sawing to avoid structurally damaging the transistor, with the scribe structure that distance may be reduced; hence, closer "packing" of the transistors may be accomplished in that structure, a more optimal density achieved.

The bonding pads, the metal layers which serve to allow electrical connections to be made to the integrated circuit, included in prior art integrated circuits are formed on a flat surface of the wafer and are accordingly of a flat or even shape. In contrast the bonding pads in the integrated circuits formed according to the present invention are fabricated on top of the areas of the configurable gate array occupied by transistors gates within the array. Since the surface in those areas as viewed on a microscopic level has the crevices and ridges from which the transistors were built up and the valleys separating rows or columns of those transistors, the relatively thin metal layer deposited thereover which serves as the bonding pad is not smooth or event but like the underlying surface is bumpy, lumpy, rough, knobby, irregular, rugged, or craggy as variously characterized, collectively referred to as bumpy. A bumpy surface has a greater surface area for a given length and width dimension than does a flat surface, characteristic of the prior bonding pads. It is believed that this surface bumpiness in the bonding pad serves to enhance adhesion between the bonding pad and external leads as well as to increase the area available to conduct heat.

The bonding pads are formed over transistors of the gate array. Consequently any additional border area is unnecessary for placement of bonding pads as in the prior design and a greater number of transistor gates may be packed in a given area of semiconductor die, achieving an enhancement in efficiency and cost saving.

The foregoing embodiment employed dies of like size and contained gate arrays of like size. Other arrangements are possible within the scope of the present invention. A different arrangement is presented in FIG. 7 in which like elements are given like labels and are primed. As shown this embodiment contains a quantity of thirty seven gate arrays and/or ASIC chips of one size and sixteen of a larger size. In this arrangement, because the rectangles do not fall along common vertical lines, the cutting cannot be accomplished in any order, but should follow thusly: First the cut must be made along the saw lane that separates the large chips from the smaller chips. Then the wafer is broken in two with the large chips in one portion and the small in the other. Thereafter each portion is sliced in a manner identical to that used on the whole wafer earlier described.

The use of a full field optical system for alignment of masks minimized the number of alignment markers required. However many systems have available step and repeat type wafer aligners, which is the more conventional masking apparatus. As known with the step and repeat wafer aligner, a photo mask exposure of a single one of the rectangular shaped integrated circuit structures at one position and the wafer is then stepped to the next position, an exposure is made at the next position and the wafer is stepped again, repeating the process until the full pattern of all the intended integrated circuits to be formed on the wafer is completed. Consequently as is industry standard, alignment markers are added to the wafer at each masking step so as to facilitate alignment at subsequent mask steps; as the wafer is moved to the next location, the alignment is carefully checked against the position of the associated alignment marker on the mask relative to its counterpart on the wafer.

A standard wafer for the step and repeat mask process is illustrated in FIG. 8. As shown the alignment markers 28 are regularly spaced on the wafer, in addition to alignment markers, process monitors 30 of the type earlier described are also illustrated in this figure, and are intended to be used with an assortment of integrated circuits that fit within the layout area indicated by the invisible lines 32, rectangular in shape. In the prior embodiment all the alignment markers fall outside the surface area to be occupied by the configurable gate array and consequently outside the area occupied by the resultant rectangular shaped application specific integrated circuits following personalization of the gate array. Effectively the rectangular shaped chip defined a smaller sized rectangle that fit within the rectangular layout area prescribed by the step and repeat aligner.

Digressing, it is noted that the adaptive size gate array of the invention also includes or subsumes small sized rectangular shaped gate arrays as specific embodiments that are formed in the layout spaces of the standard wafer and in which the alignment markers fall outside the rectangular area of the configurable gates arrays. That special case of the invention is illustrated in FIG. 9. That case, however, is not the usual case in applying the invention. With the invention, the integrated circuits to be formed may be of any size irrespective of the layout pattern defined by the step and repeat wafer aligner and E-Beam apparatus. For completeness the conventional E-Beam lithographic apparatus is illustrated partially pictorially and partially in block diagram form in FIG. 11a, which is more fully described later in this description.

To avail oneself of step and repeat type cameras or micro lithography devices, such as the laser or E-Beam type apparatus that do not have full optical field type operation and which were designed for the prior art processes, for use with the invention, the same prior art wafers, containing the same alignment markers, must be used. As illustrated in FIG. 10 to which reference is again made, the specific embodiment of circuits earlier represented in FIG. 7 is represented on such a standard wafer in this FIG. 10. The integrated circuits formed in accordance with FIG. 7 are illustrated in invisible lines. The alignment markers in many instances fall within the rectangular area defining the integrated circuit; moreover those markers fall within different positions in the different rectangles constituting the several integrated circuits. Even though each of the small sized integrated circuits formed on the wafer are intended to be identical electrically, it becomes apparent that they are not identical physically, when the standard wafer and step and repeat aligner is used, due to the "interference" of the alignment markers.

As those skilled in the art appreciate, the portion of the rectangular area occupied by the marker must be excluded from personalization in the subsequent build up of layers in the personalization process. Preferably the marker lies on the wafer in place of one or two adjacent rows of transistors; those transistors are not included in the integrated circuit chip personalization, and the personalization must be appropriately modified to accommodate this situation.

A manufacturing complication is immediately apparent. Since the physical configuration of almost every rectangular area is different, a different photomask would be required for each integrated circuit in order to form the metal and contact layers on the gate array necessary to personalize the integrated circuits, even though all of the integrated circuits on the wafer are intended to be identical in electrical function to say nothing of the cost of creating many versions of a given design. If the photographic film type maskmaking process were used then one would require as many as 32 different photographic negatives in the illustrated example. Since such masks are very expensive, that extra work and cost would detract from the benefits of the present invention. Thus one would not likely use the step and repeat camera or the photographic negative process for this purpose. Instead the more modern E-Beam type mask process is peculiarly adaptable to this embodiment, with the modification to the software programing as hereafter described.

E-Beam apparatus, and, incidentally also laser lithography apparatus, is computer controlled and contains a stored program that describes the appearance of the desired patterns to be formed in the wiring layers. By guiding the beam under control of the program as represented by the apparatus in FIG. 11a and energizing that beam at the proper positions on the wafer, the energy in the beam exposes the material or etches it to change the character for use in the process described in connection with FIG. 5a. In effect by turning the electron beam on and off at the appropriate moment in the scan or sweep, a pattern is formed on the material that has the same effect on the exposed material as the process of shining light through the photographic type mask, which is effectively a stencil. These are known pattern application devices which are presently employed in the semiconductor industry.

Figure 11A:
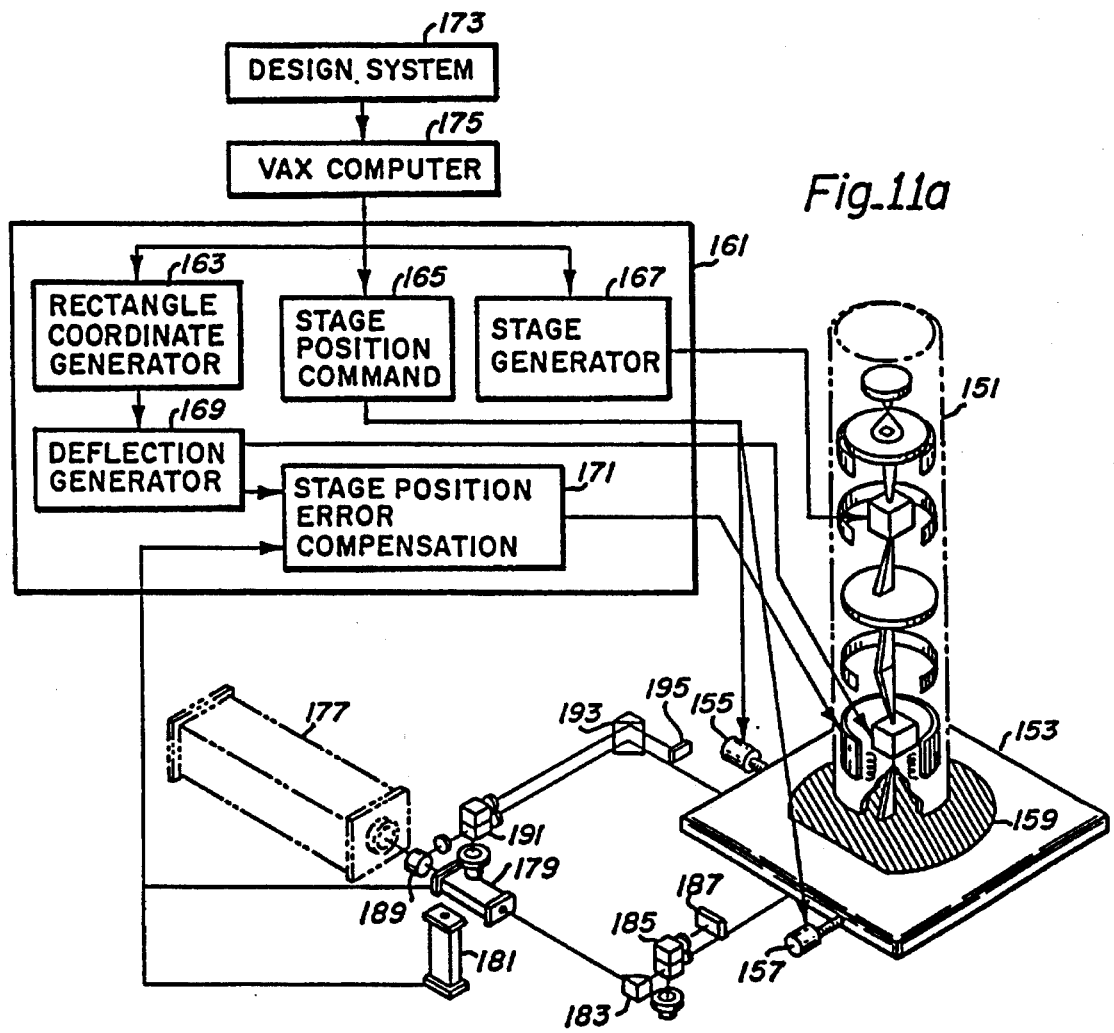
FIG. 11a illustrates an E-Beam lithography system in partial pictorial and block diagram form as may be used to practice the disclosed system.

An electron beam lithography apparatus of known structure is illustrated in FIG. 11*a* as background to the improvements to that apparatus and the process presented in this application. This apparatus is presented partially in block diagram form and partially in pictorial form in order to permit those not skilled in that particular art to more easily understand the nature and operation of that apparatus. As fully assembled the apparatus includes a controlled electron beam generating device 151 that contains an electron gun, electron beam shaping aperture, a static deflector or shaper, a second square shaped beam aperture, a demagnification lens, a static deflector and an electromagnetic deflector. The electron beam "gun" is located overlying a positionable table 153, whose position is controlled by electric motors 155 and 157, suitably of the servo-motor type. The wafer to be "masked" 159 is placed on the table under the electron gun. The controller 161 includes functional circuit devices, such as a rectangle coordinate generator 163, stage position command 165, shape generator 167, deflection generator 169, and stage position error compensation 171. The design system 173 contains the software characterizing the IC chip design and computer 175, suitably a large capacity computer such as the VAX brand produced by Digital Equipment Co., provides the control signals. To accurately determine and monitor the position of table 153 the monitoring peripheral devices including a laser light source 177, a pair of laser distance measuring devices 179 and 181 and mirrors 183 and 185, 187, 189, 191, 193, and 195 provide outputs that provide appropriate signals into the stage position error compensator.

Briefly, with the design system given, computer 175 provides signals to stage position command 165 that in turn drives the tables positioning motors 155 and 157 so as to position wafer 159 in the position, suitably the first position, necessary to mask an IC chip pattern for the first chip. For the next chip, the motors will appropriately index table 153 to the next position and so on until all the IC's intended to be placed on wafer 159 have been masked. While at a given position the computer issues commands through coordinate generator 163 to deflect the electron beam over the area of the chip. Synchronized with this, computer 175 also controls the electron beam through shape generator 167, turning the electron beam on and off, or from high intensity output and low intensity output so as to "expose" the wafer as appropriate at that location. By deflecting the electron beam over the surface area of the intended chip and turning the beam on and off in that way a picture is effectively "painted" of the circuit specified in the system design software. To ensure that the motors position the table accurately or, if not, to compensate for any inaccuracy in positioning, laser 177 generates a narrow beam of coherent light which is divided by dividers 191 and 228 and one portion extends through device 179, to deflector 183 and is applied through divider 185 to mirror 187, which serves as a calibration or position standard, and a portion is incident on and is reflected from the tables edge. Similarly, the table position in the direction normal to the above is monitored through divider 191, deflector 193, and calibration/reference mirror 195. The devices 179 and 181 are basically speaking, phase detection devices that detect or sense the wave phase change between the beam reflected from the reference mirror and the beam reflected from the edge of table 153.

Thus, dividers 191 and 185 in conjunction with devices 181 and 179, respectively, produce position error signals. In the described manner very small distances may be measured. This information is presented to error compensation stage 171 which determines if there is any difference in position between where the table was commanded to be located and the actual position of the table. If there is any difference appropriate signals are issued to the beam deflectors inside the column to correct any position error.

Given that the E-Beam device is controlled by the program, which is software, it is thus possible to vary or adapt the apparatus to a new function with another program so that the ultimate pattern produced not only avoids the alignment markers but is capable of patterns for larger than maximum size permitted on optical masks which are compatible with the type used to create master slices such as in FIG. 8. Through what programmers advise are trivial modifications to the program, the personalization masking layers may be programmed to avoid the alignment markers. The pattern effectively flows around the respective markers. This is much like the function and capability demonstrated with software publishing programs used for personal computers, like the "Ventura" publishing program, in which a graphics image may be placed in a "document" on the monitor and the text which is added to the document, essentially flows around the space occupied by the graphics image. The graphics image may be relocated and the text will automatically be reoriented through the program to flow around that occupied space.

The operation of a software routine that would operate in conjunction with automated placement and routing, otherwise known as layout software, is illustrated in flow chart form in FIGS. 11*b* and 11*c*. First the machine initializes its programs and having a "digitized" master slice, such as in FIG. 8, in memory as reference, it then searches for the initial mark. When the marker is located, the machine determines whether the marker falls within or without the predetermined 'map' area defined by stored coordinates for the array of IC's. If without, it uses the stored pattern program to generate the mask pattern. If not, it sends the stored program into the 'modification' loop.

In operation the improved E-beam apparatus, including the computer, is started and initialized with the given layout for the IC chip installed as represented at blocks 201 and 202 in FIG. 11*b* and a calculation of the coordinates is made for the original IC design as at block 203 which is stored by the computer as a first attempt or "trial" macro placement. The positions of all the alignment markers, which are standard on the master slice, are then calculated as at block 205 and stored in the computer, arranged in order, for example, starting with the top left most marker and continuing to the right and then down. Alternatively each marker may be calculated as needed on a "real time" basis to thus determine a selected marker's coordinates in which case only the equation for determining the markers position and the number of the marker need be saved in memory.

A marker coordinate check is initiated as at block 206 starting with the first of the plurality of markers to determine whether the selected marker overlaps any portion of the circuit and, if not, to check the next marker and continue with that kind of check until all of the markers are checked to ensure there is no such overlap or if overlap is found to make the changes to the design here after more fully described. Thus the first or "next" unchecked marker is retrieved as at 207 and a check is made as at 208 to determined whether the particular IC design, the macro layout, had earlier had its coordinates "revised" from that specified in the original design, the purpose of which becomes more clear hereafter. Being the initial test the answer is in the negative and the original IC Design coordinates are retrieved as at 210 and compared with the coordinates of the first retrieved marker as at 211. As represented at decisional block 212, if there is an overlap, a "flag" is set as at 213 and an "initiate" step 214 is commenced, which continues as depicted in FIG. 11c. If, however, there is no overlap as at 215, the program checks to determine if any remaining markers are yet untested. Assuming that the second marker is untested a "yes" answer occurs at decisional block 216 and the program returns to block 207 to retrieve the next marker and repeat the foregoing process with respect to the second marker. When the last unchecked marker is reached and processed in the foregoing manner a "no" decision eventually results at decisional block 216 and the next part of the program is initiated as at block 214 presented in FIG. 11c.

Assuming that an overlap was detected on the nth marker, say marker number 2, resulting in a set flag at 213 and the initiation of the steps presented in FIG. 11c to which reference is now made. A check is made for the flag as at 315, which according to the given assumption results in a "yes" report at decisional block 316.

The computer then revises the IC design layout. As earlier described, the IC system design resides in the form of software in the computer. Specifically, since the coordinates of the marker are known and the row in which the marker resides is known, the new design, for example, eliminates that row or topological area for use by any macro. By simply identifying to the computer the area to be blocked out, the macro layout may be formed about the blocked out portion. Further, as has been illustrated, more often than not a number of markers are arranged in a horizontal row. The design criteria may be simplified as preferred by simply blocking macro placement for the whole horizontal row from the IC chip macro layout design. As earlier mentioned, this modification to an IC system design is believed to be a trivial programmer's solution, given this objective, akin to the methodology used in "desktop" publishing, wherein text is "flowed" around a portion of the document containing a "graphic" image. The design constraints are not here further addressed since those are known to those skilled in the art, although some suggestions for performing such task with greater efficiency are hereinafter presented.

The revised IC design coordinates at 317 are stored as a revised IC design as indicated at block 318 and the flag that was earlier set at block 213 in FIG. 11b is reset at block 319 and another check is made for the existence of an untested marker as at 320. It is noted that the flow chart presented illustrates an additional block 320, in other presentations the branch point at 319 may be extended back to block 315; the result is the same. With a positive decision, the program then goes to point A in FIG. 11b and the next marker is retrieved as at block 207 represented in that Figure.

Referring again to FIG. 11b, once the check at 215 establishes that there are no markers remaining that have not been checked as at 215 and there is no overlap so that the decision at block 216 is negative or the decision at block 321 is negative, as represented in FIG. 11c, a recheck is made for a revised design as at block 322 and the positive or negative decision at block 323 results in retrieval of the latest revised design or the original design, respectively, the design is then checked for the existence of empty rows as at block 326. If the check proves negative as at block 327 the end of the post processing procedure is reached. If, however, the check proves positive, then the IC design is preferably revised as at 328 so as to close up the unnecessary gap in space as would otherwise unnecessarily result in wasting those transistor elements located in the underlying space.

Once the revised design has been determined by the post processing described, the E-beam apparatus operating in the conventional manner applies that design to the section of the wafer.

With the foregoing steps performed by the described apparatus and a revised design having been obtained for placement in the one described position on the wafer, the E-beam apparatus is advanced to the position on the wafer overlying the next IC chip location, as in the existing E-beam apparatus, and the process is again repeated to possibly create yet another "version" of the same IC design applied to the wafer in the previous steps. Hence one can envisage a number of different physical layouts through different wiring patterns for the macros, all of which accomplish the same functions and are within the prescribed performance limits and are otherwise the same integrated circuit chip. If one earlier questioned the purpose of blocks 226 and 228, the purpose now should be clear: When the E-beam lithographic apparatus is operated at this second position, the IC design now being used for comparison purposes may be a revised version, in which changes were made to remove overlap with markers and markers may not be positioned the same in this second IC position on the wafer. This operation continues until all of the designs are made and applied to the wafer.

Using gaps and otherwise unused space in a CGA layout is an ordinary and common occurrence and is accomplished with modern day place and route software, both commercially available and privately owned as known from applications notes, articles and conversations with software applications engineers. This place and route software is one in the same as that used to create the initial "trial" macro placement mentioned earlier.

A useful modification to the programmed apparatus just described could be made by retaining and retesting the marker that resulted in a change in the IC design as at block 317. This is accomplished introducing a branch at step 319 to retrieve the last marker and send that last marker into decisional block 208. In as much as the IC design coordinates were changed as just described, the check for revised IC design as at block 208 in this instance yields an affirmative answer and the revised design coordinates of the IC Design are retrieved, as at block 209 and compared with the coordinates of the retrieved marker as at block 211. At this stage the marker is the same marker that resulted in the changing of the IC design; this step serves as a check to the correctness of that design. If the check fails a revised layout results. Assuming all went well the check at 212 is negative, and with markers remaining untested the next marker is retrieved at 207.

Designs of high complexity and/or performance require relatively large amounts of computing time for layout and post layout timing analysis. Many different layouts, as in the previously mentioned embodiments for one such design could very well become prohibitively expensive in computing time for layout and timing analysis to say nothing of the associated human effort.

Figure 11D:
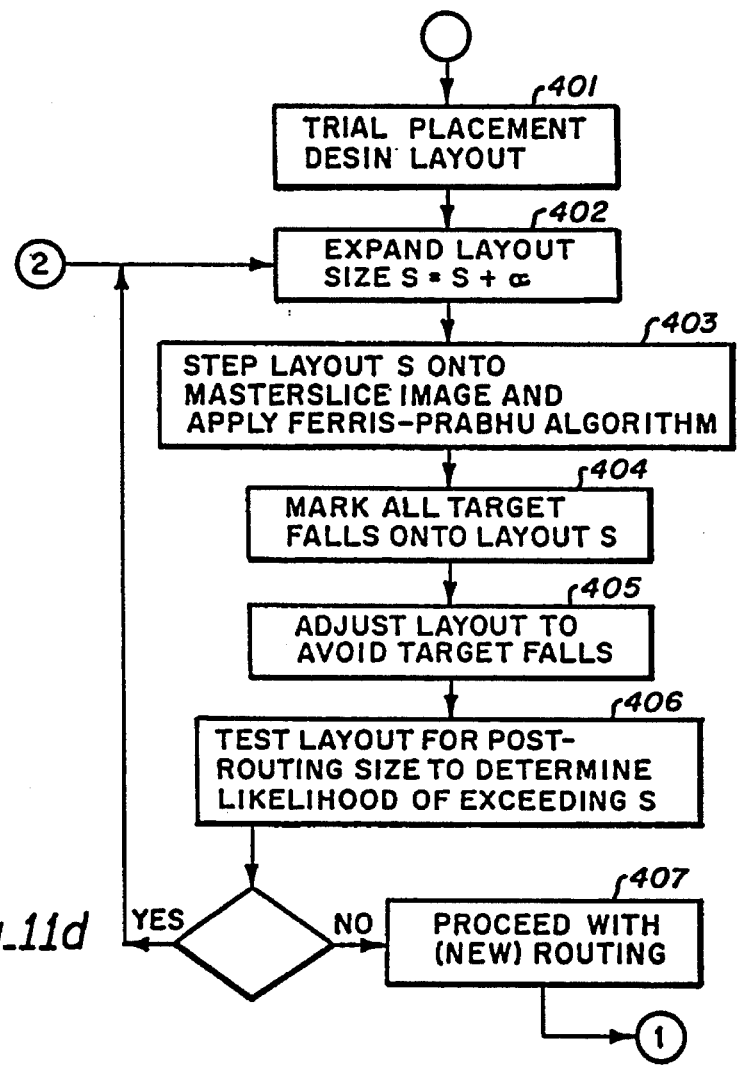
FIGS. 11d and 11e illustrate in flow chart form a wafer placement optimizer useful with the apparatus of FIGS. 11b and 11c.
Figure 11E:
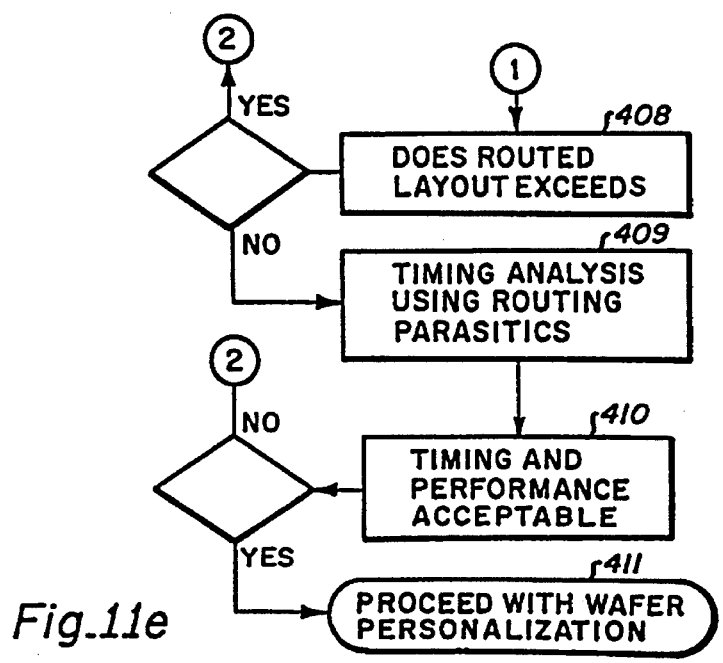

A preferred embodiment of the artwork related software for high complexity/performance designs is to optimize the design layout in such a way that a single version of the layout can be placed uniformly and in rank and file fashion upon the master slice without interfering with any of the alignment targets. A process for doing so is presented in FIGS. 11d and 11e.

This process begins in block 401 in which an initial placement of macros is made for a given design using "off-the-shelf" place and route software. This "trial" placement does not contain routing but has space set aside for the routing, the amount and distribution of which is based on an estimate of required routing space. The size of this "trial" layout is passed to block 402 where it is increased by an amount, which is an estimate of the area impact of avoiding the alignment targets. Various algorithms may be applied at this juncture to make the die per wafer versus computing cost trade-off. For example, as the vertical die dimension approaches the vertical distance between the alignment targets, the number of target falls in the ultimate layout that is tightly packed onto the master slice can become very large, such that design performance is negatively impacted.

The extended layout "footprint" determined at block 402 is passed to block 403 where various schemes, such as the Ferris-Prabhu algorithm, may be applied in order to achieve the maximum die per master slice where, in essence the extended layout footprint is stepped out onto the master slice image that is stored in computer memory which, necessarily contains the coordinates of all the alignment targets relative to the center of the master slice.

The location of all the target relative to the extended layout footprint are stored for each layout placement on the master slice and then is merged to form a composite of all "target falls" onto a single extended layout footprint. This composite image of target falls is passed to block 405 where the trial macro placement is adjusted so that no macro placement occurs over a target, since there will be no base transistors in the target locations as previously mentioned.

The modified placement size is checked in block 406 to determine whether or not were this modified placement to be routed, it would be likely to or certainly exceed the previously established die size from block 402. If the answer is yes, then program control returns to block 402 for further extension of the layout footprint and the steps 403 through 406 are repeated. This could continue until the criteria of block 406 are met. When the criteria of block 406 are met, then control proceeds to block 407 where the layout process is completed by the routing of the adjusted macro placement which is carried out as usual with suitable and readily available automated gate array routing software.

The dimensions of the completed layout are passed to block 408 where, again, as in block 406, they are checked against those used last in block 403. If the complete layout exceeds the dimensions used last in block 403, then the footprint of this layout is passed back to block 402 and the current routing is discarded, program control proceeds through blocks 403 to 408 until the criteria of 408 is met. When this occurs, the circuit loading parasitics of the routing in the final layout are passed to block 409 where a timing analysis is performed by hand and/or automated means. Automated timing analysis programs, or tools as they are called, are readily available from commercial industry. Once the timing analysis is complete, control proceeds to block 410 a decision is made whether or not the design performance will be acceptable. If not, it is likely that a larger die size and the attendant decrease in the number of target falls will result in improved, usually meaning faster design performance although some amount of master slice area will now go to waste as the die size now, in fact exceeds just that required to accommodate the finish layout. This point in the process flow is particularly amenable to manual intervention in the interest of optimization. Finally, if the performance characteristics are deemed acceptable, the final artwork of single design layout may be applied to the physical master slice using the direct write E-Beam wafer patterning system or an optical stepper or full field aligner as appropriate to the given die size.

Figure 12:
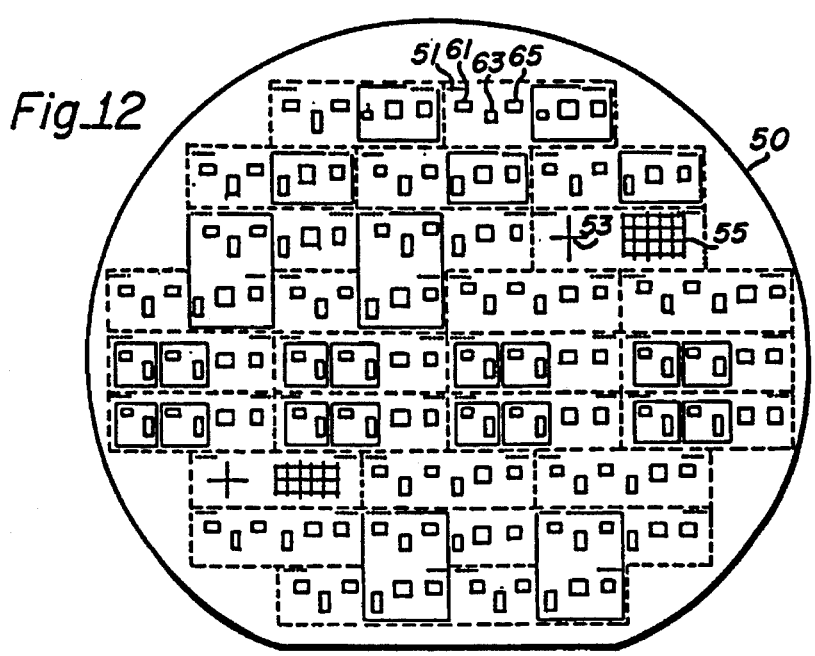
FIG. 12 illustrates a further embodiment of the novel master slice in which areas of the wafer are allocated to non-CGA custom circuits such as high density RAM, ROM and ALU.

Those skilled in the art appreciate the versatility of the master slice structure for a configurable gate array presented in the foregoing embodiments. Those skilled in the art appreciate also that the present invention may be modified in additional ways and improved upon all of which fall within the scope of the invention. For example, the invention may be employed as a hybrid arrangement, one in which configurable gate arrays and application specific integrated circuits, even high density RAM and/or ROM that do not use the configurable gate array as an underlying structure may share the wafer, and share a portion of individual regions on the wafer and together form an integrated circuit. Reference is made to FIG. 12 which illustrates this additional embodiment.

Wafer 50 contains the "sea" of gates covering the entire surface, excepting the areas occupied by the alignment markers, such as marker 51 and 53, only one of which is labeled, the process test circuitry 55, two of which are contained on the wafer as illustrated; the full-custom integrated circuits formed in rectangular shaped "patches" or islands as indicated 61, 63, and 65. For example, random access memory, RAM, or a read-only memory, ROM, which can be programmed in the same layers of the configurable gates in the surrounding array; or an arithmetic logic unit, ALU, may be included. The arrangement of full custom "blocks" of integrated circuits is most amenable to IC's intended for digital signal processing and computer bus interface applications. A master slice prepared according to the invention could be "tuned", by including appropriate type, size and quantity of full custom blocks, to a particular class of application thereby taking utmost advantage of the full custom density and performance coupled with the quick turn around time available with configurable gate array fabrication.

In summary the sea of gates take up more than one-half of the wafers surface area, at least, with the alignment markers and test circuits taking up a small portion of the available area.

Reference is made to FIG. 13, which, as example, illustrates a segment of a wafer whose geometry is the same as that of the wafer of FIG. 1 but in which the alignment markers occupy patches of space, islands, that are void of any transistors instead of being located in a position overlying transistors as previously illustrated in FIG. 1. The patch of surface may be referred to as an island and such island may be referred to as being located in a sea formed by the gates. The island is contiguous with the surrounding area occupied by the transistor gates. The markers are not contiguous, but are displaced from one another in position on the wafer. A somewhat exaggerated not-to-scale illustration of the island ocuupied by marker 6 in the upper right side of the wafer is designated 6'. A like area is shown for a like marker at the lower left side of the figure. In other respects the processing of the wafer of this figure, as apparent, is the same as was described for the wafer of FIG. 1.

In the wafer of FIG. 14 large peripheral border areas, generally represented by 350, are retained, suitably, with pure metal coatings. This border area is a wide strip, one side of which is congruent with the wafer's edge. The strip typically is about one centimeter in width, that is, radially inwardly from the wafers outer edge, for the eight inch wafers used by the present applicants. The width of that strip may vary with different kinds and or sizes of wafers which may be readily empirically determined. No transistors are formed in such border areas. In other respects the wafer and its treatment and further processing is the same as that described for the wafer of FIG. 1. For this version of the master slice, the wafer form presented in FIG. 15a may be used. FIG. 15a partially illustrates the wafer at the same stage of processing existing as the wafer of FIG. 5c, earlier discussed in connection with the preceeding embodiments.

On a custom essentially hand made basis, wafers may be fabricated to the designs discussed in connection with the embodiment of FIG. 1. However, it has been found that inherent deficiencies in production semiconductor processing to date does not provide adequate processing in the peripheral border areas of the wafers employed in this invention. Transistors formed in those peripheral areas more often than not do not meet the high standards required and are, hence, regarded as defective. The reasons why present production processing is so limited is not known to applicants. As a practical matter thus it is thought preferable simply to eliminate formation of transistors in those border areas, thereby avoiding any temptation of the designer to use that unavailable geography; hence, the version of the invention presented in FIGS. 14 and 15a in this description results. In a sense this form of the invention reduces the scope of space utilization efficiency that may be achieved at least in mass production as less transistors are formed and, hence, in that sense the structure is less preferred. Nontheless the use of the total area of the wafer to achieve the greatest population of transistors, as in the embodiment of FIG. 1, remains as a goal, and is dependent upon future improvement in chemical processing production technology.

Additionally since most dies or chips formed on the wafer are formed of transistors arranged in a rectangular shape pattern, as is the custom in the industry, there will also be some additional wafer geography that is not used. This results from fitting those rectangular shaped areas within the wafer's central region with the outermost corner of the rectangle being located near or even touching the inner edge of the border strip, which as shown is generally circularly curved. Consequently with two adjacent rectangular areas formed with transistors and with those adjacent rectangular areas slightly horizontally displaced from one another, as example, referring again to FIG. 14, an additional generally triangular area of the wafer, is formed between the sides and corners of such adjacent rectangular areas, such as chips 352 and 354 and curved border strip 350, such as illustrated at 356, 358, and the border strip in FIG. 14. Forming transistors in those triangular areas or not is regarded as a designer's choice. From a broader perspective the outer edges of the rectanguar shape of the formed semiconductor chips together create a stair case appearance as shown. Looking at the border area in that case, the inner edge of the border area defines a stair case appearance and is not simply a web like band. Although satisfactory transistors may be formed in such triangular area, one might choose not to do so, since those transistors would not be used as part of any die or chip being formed on the wafer. Should one decide to eliminate formation of transistors in those areas, the underlying wafer, at the stage of processing corresponding to that earlier discussed in connection with FIG. 5c, would appear as in FIG. 15b.

The alternative embodiment for the wafer illustrated in FIG. 16 incorporates not only the principle of a void peripheral border area 350 that was earlier described in connection with FIGS. 14 and 15a but also uses the void or island within the more central regions of the wafer in which to position the alignment markers as was earlier described and used in connection with the emboidiment of FIG. 13. As the reasons have been adequately separately discussed in connection with the prior figures, they are not here repeated.

The expanse of the sea formed by the standard gates covers a great enough region of the wafer to include therewithin many rectangular shaped areas, at least two, in which semiconductor chips are to be formed. Within each of those rectangular shaped areas the gates are capable of being formed into an input circuit and at least some portion of the gates are ultimately used for that purpose. Similarly within each of those rectangular shaped areas the gates are also capable of being formed into an output circuit and at least some portion of the gates are ultimately used for that purpose. Gates not used for either of the preceeding purposes, typically the majority of gates within each rectangular region is used for other circuit purposes. The foregoing generalization is applicable irrespective of whether or not any one or more of such rectangular shaped regions subsumes or includes the islands, described earlier.

It is believed that the foregoing description of the preferred embodiments of the invention are sufficient in detail to enable one skilled in the art to make and use the invention. However, it is expressly understood that the details of the elements which are presented for the foregoing enabling purpose is not intended to limit the scope of the invention, in as much as equivalents to those elements and other modifications thereof, all of which come within the scope of the invention, become apparent to those skilled in the art upon reading this specification. Thus the invention is to be broadly construed within the full scope of the appended claims.

What is claimed is:

1. A master slice, comprising:

a semiconductor wafer;

a sea of gates formed in and covering substantially the entire surface of said semiconductor wafer, said sea of gates defining a configurable gate array having a continuum of transistors from which at least one application specific integrated circuit (ASIC) chip is capable of being formed by selectively connecting together a subset of the continuum of transistors and cutting through unconnected transistors to separate the ASIC chip from the wafer, said configurable gate array being free of predefined boundaries along which the semiconductor wafer must be cut; and a plurality of islands in said sea of gates and separate from the transistor continuum for aiding in forming the ASIC chip prior to its separation from the wafer.

2. The master slice as defined in claim 1 wherein at least one of said plurality of islands contains an alignment marker.

3. The master slice as defined in claim 2 wherein at least one of said plurality of islands contains test means for evaluating characteristics of said master slice.

4. The master slice as defined in claim 3 wherein at least one of said plurality of islands contains an application specific integrated circuit.

5. The master slice as defined in claim 1 wherein said sea of gates are arranged in rows and columns.

6. The master slice as defined in claim 5 wherein at least one of said plurality of islands comprises an alignment marker; and wherein at least one other one of said plurality of islands comprises a non-gate array semi-custom circuit, including semiconductor devices of types different from said at least one transistor forming said sea of gates.

7. A master slice, comprising:

a semiconductor wafer;

said semiconductor wafer having a surface of predetermined surface area on which to form transistors;

a continuum of uniformly spaced transistors formed in and covering at least a major portion of said predetermined surface area of said semiconductor wafer with said transistors being of substantially identical N-channel and P-channel MOSFET transistors, said transistors defining a configurable gate array from which at least one application specific integrated circuit (ASIC) chip is capable of being formed, said configurable gate array being free of predefined boundaries along which the semiconductor wafer must be cut; and a plurality of islands in said surface area surrounded by said plurality of transistors, said islands being void of said transistors and occupying a minor portion of said predetermined surface area to define a locale for receiving devices other than said transistors.

8. A master slice configurable gate array for use in the producing of at least two semiconductor chips, each of said semiconductor chips having an area which includes at a base layer level only a plurality of transistors, comprising:

a semiconductor wafer;

said semiconductor wafer having a predetermined surface area on which to form said configurable gate array;

said configurable gate array being formed from a continuum of transistors formed in and substantially covering at least a major portion of said predetermined surface area of said semiconductor wafer and being free of predefined boundaries therebetween;

said transistors being of substantially identical N-channel and P-channel type MOSFET transistors; and said continuum of transistors defining a region of said predetermined surface area within which said semiconductor chips are formed entirely of said transistors by selectively connecting together a subset of the continuum of transistors and cutting through unconnected transistors to separate the ASIC chip from the wafer.

9. The master slice as defined in claim 8, wherein a portion of said predetermined surface area comprises:

a vacant peripheral area extending in a band on said predetermined surface area and along an edge of said wafer surrounding said sea of transistors to define a border on said wafer between said wafer edge and said sea of transistors, said vacant peripheral area being void of any of said transistors.

10. The master slice as defined in claim 9, further comprising:

a plurality of islands in said predetermined surface area surrounded by said continuum of transistors, said islands being void of said transistors and occupying a minor portion of said predetermined surface area to define a locale for receiving devices other than said transistors.

11. The master slice as defined in claim 8, further comprising:

a plurality of islands in said predetermined surface area surrounded by said continuum of transistors, said islands being void of said transistors and occupying a minor portion of said predetermined surface area to define a locale for receiving devices other than said transistors.

12. The master slice as defined within claim 11 wherein at least one of said islands falls within said region of said predetermined surface.

13. The master slice as defined in claim 11 wherein at least one of said islands falls outside of said region of said predetermined surface.

14. The master slice as defined in claim 11 wherein at least one of said plurality of islands contains an alignment marker.

15. The master slice as defined in claim 11 wherein at least one of said plurality of islands contains test means.

16. The master slice as defined in claim 11 wherein at least one of said plurality of islands contains an application specific integrated circuit.

17. The master slice as defined in claim 8 wherein at least a portion of said continuum of transistors within said region comprises an input to and another portion of said continuum of transistors and an output to the remainder of said continuum transistors within said region.

18. A configurable gate array comprising:

a semiconductor wafer having a major surface;

a continuum of transistors that are uniformly spaced in rows and columns throughout substantially the entire major surface of the wafer, said transistors being free of boundaries therebetween, said wafer containing a sufficient number of transistors to form a variety of application specific integrated circuit (ASIC) chips of different sizes from the same wafer size, the ASIC chips ranging from an ASIC chip of a first size using a first number of transistors to a second ASIC chip of a second size utilizing substantially all of the continuum of transistors in the wafer; and saw lane channels overlying selected portions of the transistors in the semiconductor wafer, said saw lane channels defining lanes for cutting the wafer through portions of the underlying transistors to define a desired ASIC chip from the wafer.

* * * * *